United States Patent [19]

Watanabe

[11] Patent Number: 5,464,997
[45] Date of Patent: Nov. 7, 1995

[54] CHARGE DETECTION DEVICE, A METHOD FOR PRODUCING THE SAME, AND A CHARGE TRANSFER AND DETECTION APPARATUS INCLUDING SUCH A CHARGE DETECTION DEVICE

[75] Inventor: Takashi Watanabe, Kyoto, Japan

[73] Assignee: Sharp Kabushiki Kaisha, Osaka, Japan

[21] Appl. No.: 284,928

[22] Filed: Aug. 2, 1994

[30] Foreign Application Priority Data

Apr. 1, 1994 [JP] Japan .................................. 6-065203

[51] Int. Cl.$^6$ ........................ H01L 29/796; G11C 19/28
[52] U.S. Cl. ........................ 257/239; 257/218; 257/224; 377/60
[58] Field of Search ................... 257/239, 216, 257/218, 224; 377/60

[56] References Cited

U.S. PATENT DOCUMENTS

| | | | |
|---|---|---|---|
| 4,074,302 | 2/1978 | Brewer | 257/239 |
| 4,672,645 | 6/1987 | Bluzer | 257/239 |
| 4,984,045 | 1/1991 | Matsunaga | 257/239 |
| 5,223,725 | 6/1993 | Miwada | 257/239 |
| 5,229,630 | 7/1993 | Hamasaki | 257/239 |
| 5,357,128 | 10/1994 | Shinji | 257/239 |

OTHER PUBLICATIONS

Carlo Sequin et al., *Charge Transfer Devices*, pp. 97–116, (Academic Press, New York, 1975).
R. J. Brewer, "A Low Noise CCD Output Amplifier," in *1978 International Electron Devices Meeting Technical Digest*, pp. 610–612, Dec. 1978.

M. Morimoto et al. "Low Noise Ring–Junction–Gate Amplifier for CCD Signal Charge Detection," *1978 Convention Record* of the Institute of Television Engineers of Japan, Jul. 1989.

Y. Matsunaga, "High Sensitivity Charge Detectors for Charge Coupled Devices," in *Institute of Television Engineers Technical Report*, vol. 13, No. 64, pp. 21–24, IPU '89-30, Dec. '89 23.

*Primary Examiner*—Gene M. Munson
*Attorney, Agent, or Firm*—David G. Conlin; Milton Oliver

[57] ABSTRACT

A charge detection device for converting a signal charge consisting of carriers of a first polarity externally provided into a voltage signals, the charge detection device comprising a MOS transistor, the MOS transistor including: a first semiconductor layer having a transistor channel for carriers of a second polarity; an insulating layer provided on the first semiconductor layer; and a gate electrode provided on the insulating layer, wherein transistor characteristics of the MOS transistor are changed by the signal charge accumulated in a surface region the first semiconductor layer immediately below in interface between the first semiconductor layer and the insulating layer, thereby detecting a quantity of the signal charge.

13 Claims, 18 Drawing Sheets

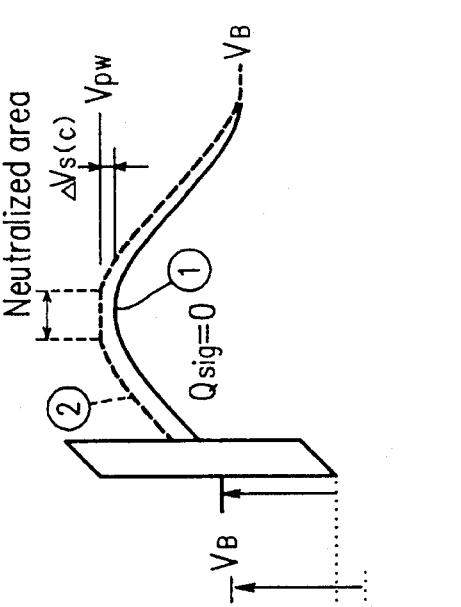
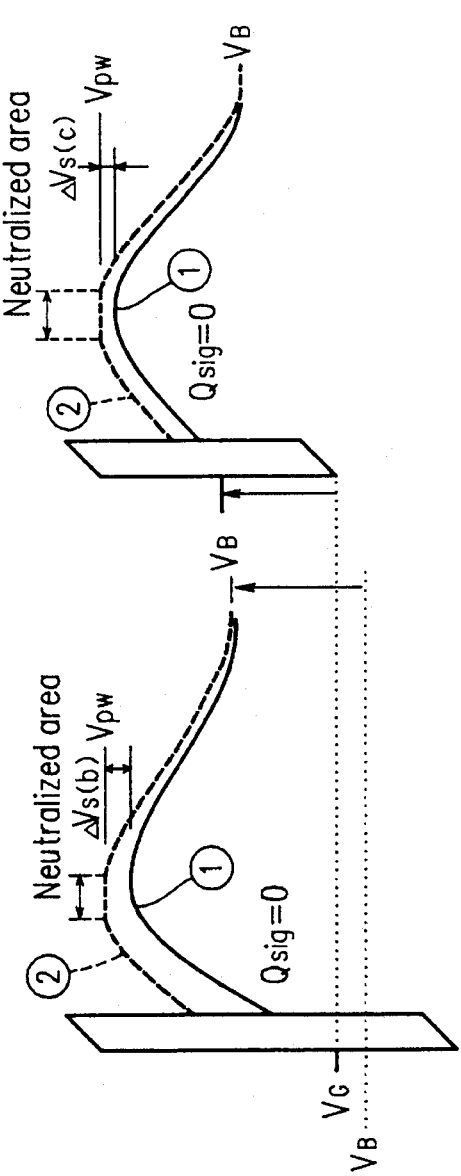
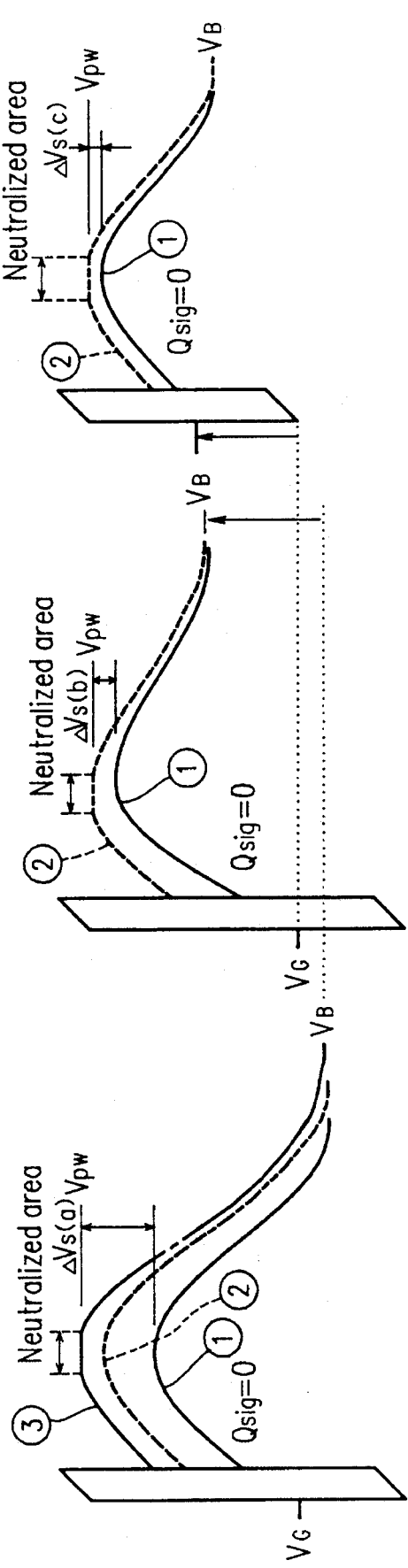
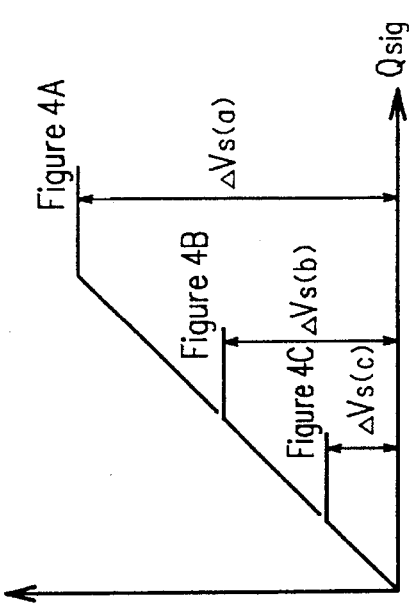

A cross section | B cross section
*FIG.7(1)A* | *FIG.7(1)B*
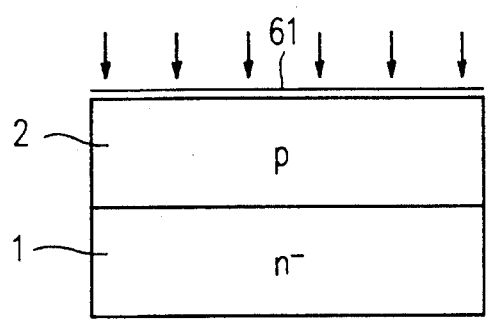 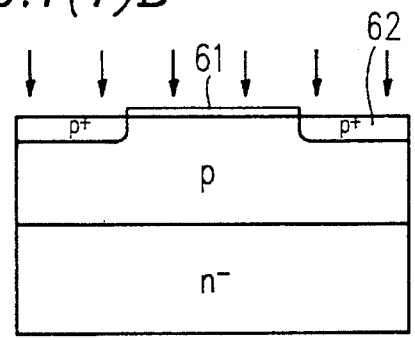
*FIG.7(2)A* | *FIG.7(2)B*
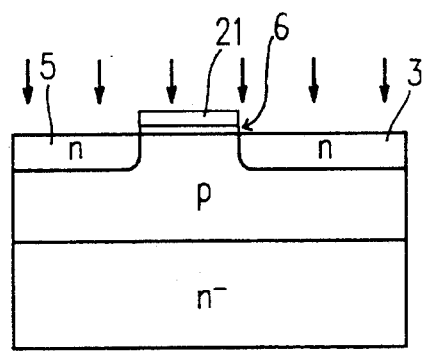 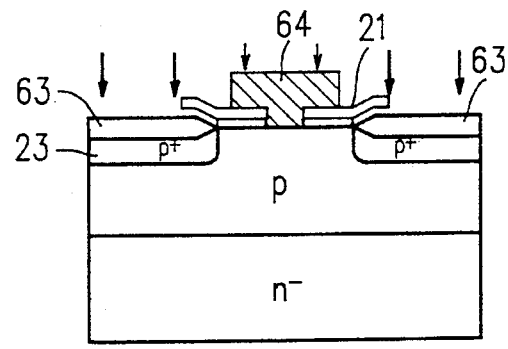

A cross section | B cross section
FIG.7(3)A
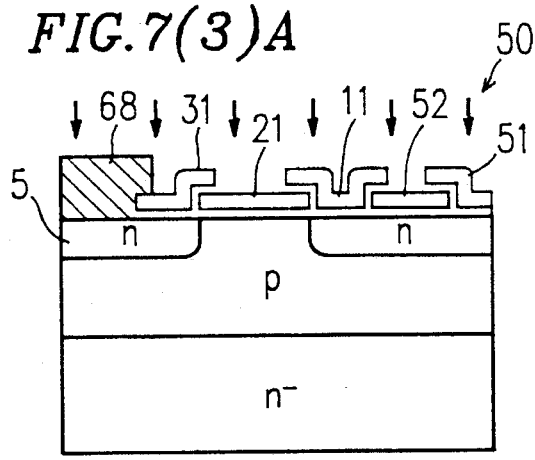
FIG.7(3)B
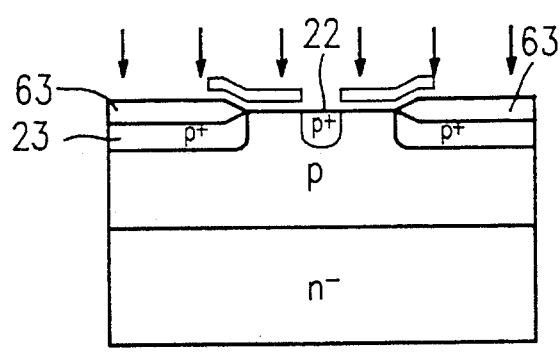
FIG.7(4)A
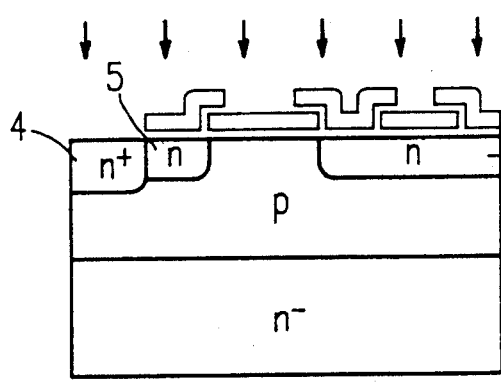
FIG.7(4)B
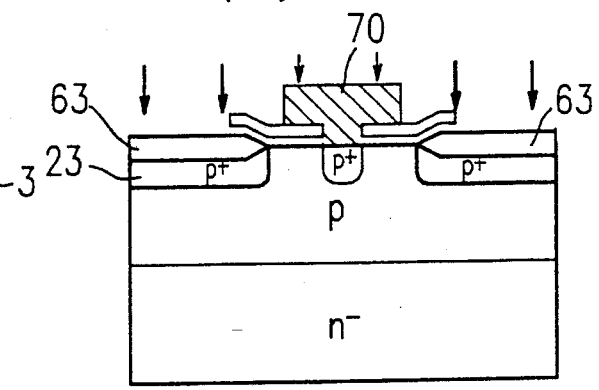
FIG.8
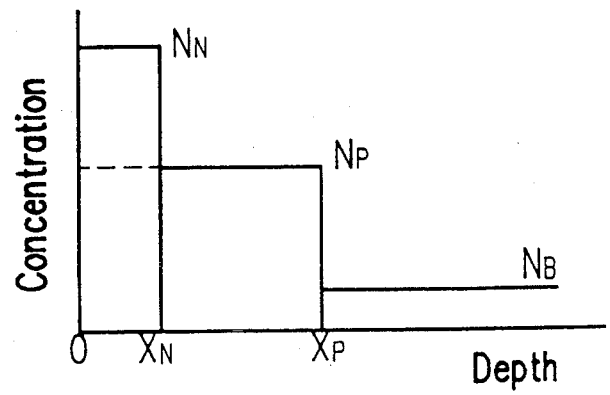

A cross section · B cross section
FIG.9(1)A
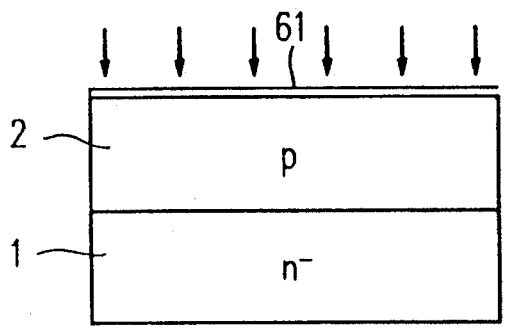
FIG.9(1)B
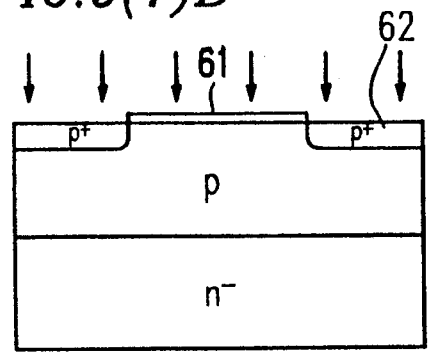
FIG.9(2)A
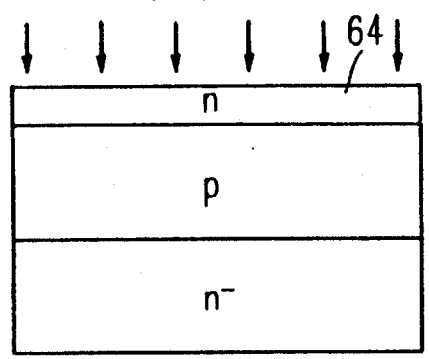
FIG.9(2)B
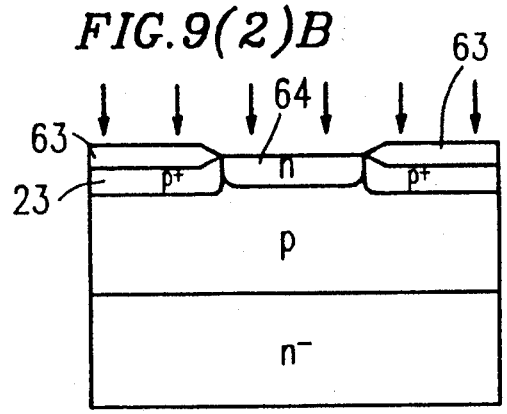
FIG.9(3)A
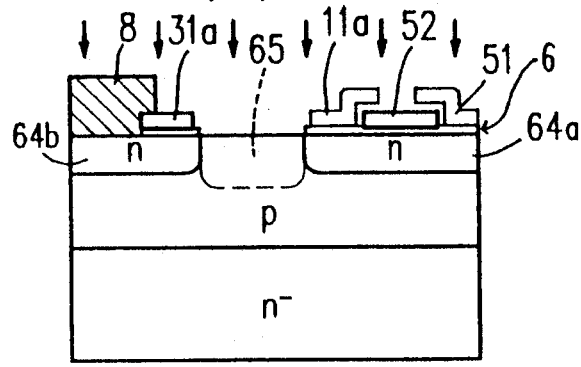
FIG.9(3)B
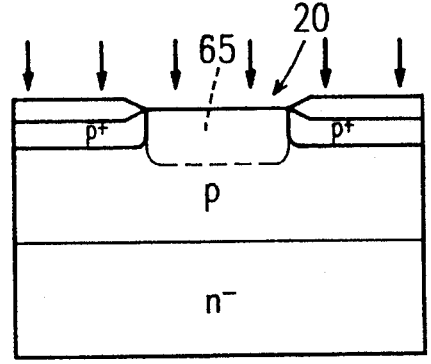

A cross section
FIG.9(4)A
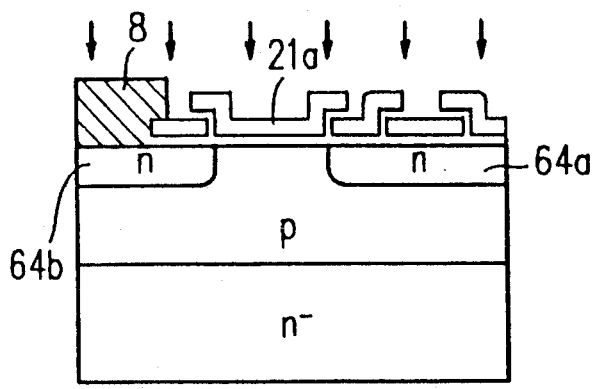
B cross section
FIG.9(4)B
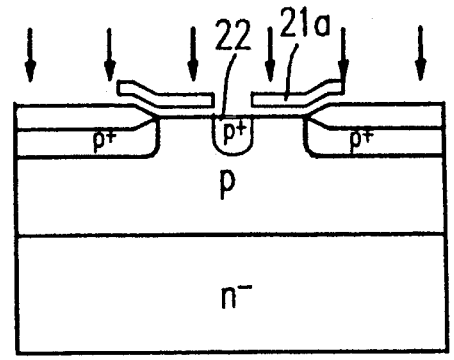
FIG.9(5)A
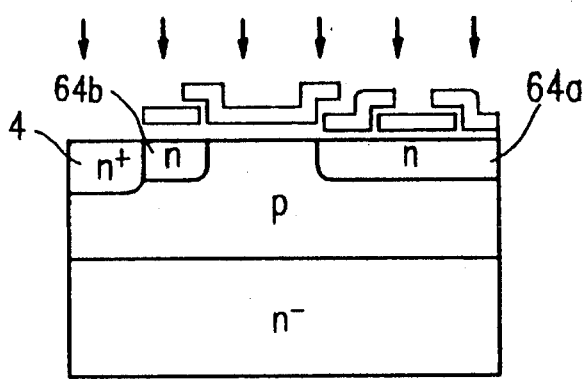
FIG.9(5)B
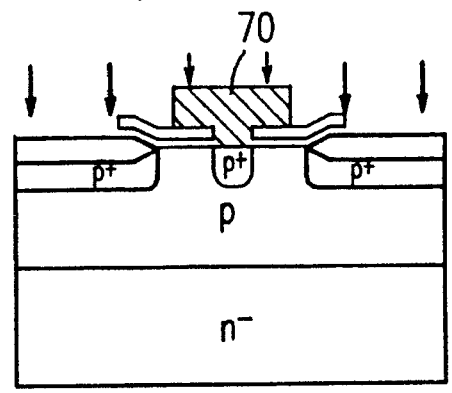

Signal charge transfer direction

Signal charge transfer direction

*PRIOR ART*

*PRIOR ART*

*PRIOR ART*

*PRIOR ART*

Signal charge transfer direction

Potential

PRIOR ART

CHARGE DETECTION DEVICE, A METHOD FOR PRODUCING THE SAME, AND A CHARGE TRANSFER AND DETECTION APPARATUS INCLUDING SUCH A CHARGE DETECTION DEVICE

BACKGROUND OF THE INVENTION

1. Field of the Invention

The present invention relates to a charge detection device used, for example, in combination with a charge transfer device such as a charge coupled device (hereinafter, referred to as a "CCD"), a method for producing the same, and a charge transfer and detection apparatus including such a charge detection device and a charge transfer device.

2. Description of the Related Art

Charge transfer devices such as CCDs are widely used for, for example, image sensors. Especially, buried-channel type CCDs, in which a signal charge is transferred in the state of being kept far from a surface of a semiconductor layer and thus without being influenced by the surface, have a high transfer efficiency. For such an advantage, most of the CCDs in practical use are of the buried-channel type. For converting a signal charge transferred by the CCDs into a voltage signal, various detection devices have been proposed.

Briefly referring to FIGS. 13A and 13B, a charge detection device of a floating diffusion amplifier (hereinafter, referred to as "FDA") type will be described. FIG. 13A is a schematic top view of a charge detection device 81 of the FDA type, and FIG. 13B is a diagram illustrating the potential distribution in the direction in which a signal charge is transferred in the charge detection device 81.

As is shown in FIG. 13A, the charge detection device 81 is provided at an end area of a charge transfer device 100 for receiving a transfer clock $\phi_1$. The charge detection device 81 includes an output gate section 101 for receiving an input gate signal OG, a floating diffusion (hereinafter, referred to as "FD") section 102, a reset gate section 103 for receiving a reset gate signal $\phi_R$, and a reset drain section 104 for receiving a reset drain signal RD in this order in the signal charge transfer direction. The FD section 102 is connected to the gate of a driving transistor $T_D$ of a source follower 10.

The charge detection device 81 operates in the following manner.

When a signal charge $Q_{sig}$ reaches the FD section 102 via the output gate section 101, the signal charge $Q_{sig}$ is converted into a voltage $V_{sig}$ expressed by Equation (1) by a capacitance $C_{FD}$ generated by the FD section 102, a wire connected to the FD section 102, the gate of the driving transistor $T_D$, and the like.

$$V_{sig} = Q_{sig}/C_{FD} \quad (1)$$

The voltage $V_{sig}$ is amplified, namely, reduced in impedance by the source follower 10, and then is output to an external device. The signal charge in the FD section 102 is sent to the reset drain section 104 via the reset gain section 103 every transfer period. In other words, the potential of the FD section 102 is reset to a reset voltage every transfer period.

The charge detection device 81 of the FDA type has the following problems.

As is shown in FIG. 13B, the potential of the FD section 102 becomes higher or lower than a potential B of the reset drain section 104 by a slight level $\Delta V_a$ during the reset operation by the channel thermal noise of the resets gate section 103 or the like, thereby Generating reset noise. Further, the capacitance $C_{FD}$, which includes various elements including the junction capacitance of the FD section 102, the capacitance of the wire connected to the FD section 102, and the gate capacitance of the driving transistor $T_D$, is limited in reduction. For these reasons, the gain of conversion of a signal charge into a voltage signal cannot be sufficiently high.

In order to solve such a problem, a charge detection device of a floating Gate amplifier (hereinafter, referred to as "FGA") type shown in FIGS. 14A and 14B has been proposed. FIG. 14A is a schematic top view of a charge detection device 82 of an FGA type, and FIG. 14B is a diagram illustrating the potential distribution in the signal charge transfer direction in the charge detection device 82.

As is shown in FIG. 14A, the charge detection device 82 includes a floating Gate 110 in a middle area of the charge transfer device 100. The floating gate 110 is connected to the Gate of the driving transistor $T_D$ of the source follower 10.

As is shown in FIG. 14B, when the signal charge $Q_{sig}$ is transferred to below the floating gate 110, the potential of the floating gate 110 is modulated by the signal charge $Q_{sig}$ and output to an external device via the source follower 10. The floating gate 110 is capacitively coupled with a bias electrode $V_B$.

Since the charge detection device 82 of the FGA type includes no reset gate section, and thus channel thermal noise is not generated, generation of reset noise is prevented. Nonetheless, this type of charge detection device 82 has a problem in that, since the potential of the floating gate 110 is controlled only in terms of the capacitance, drift or the like cannot be prevented, and thus stability is not sufficient.

Further, in the case of the charge detection device 82 of the FGA type, as in the charge detection device 81 of the FDA type, a section for converting a signal charge into a voltage signal and a section for amplifying the voltage signal are configured separately. For this reason, the capacitance includes the capacitance of the floating gate 110, the capacitance of the wire connected to the floating gate 110, and the capacitance of the gate of the driving transistor $T_D$, and thus cannot be reduced sufficiently. Accordingly, enhancement of the gain of conversion of a signal charge into a voltage signal is limited.

Under these circumstances, charge detection devices including a section for converting a signal charge into a voltage signal and a current amplification circuit formed on the same plane in an integrated manner have recently been proposed.

As a first example of such a charge detection device, a floating surface detector (hereinafter, referred to as an "FSD") described in R. J. Brewer, *A Low Noise CCD Output Amplifier*, IEDM Tech. Dig., pp. 610–612 (December, 1978) will be described with reference to FIGS. 15A through 15D. FIG. 15A is a schematic top view of such an FSD 83, FIG. 15B is a diagram illustrating the potential distribution in the signal charge transfer direction, FIG. 15C is a cross sectional view of the FSD 83 taken along line E—E in FIG. 15A, and FIG. 15D is a diagram illustrating the potential distribution in the depth direction of the FSD 83 along line F—F in FIG. 15C.

As is shown in FIGS. 15A and 15C, the FSD 83 includes a gate section 120 for receiving a DC potential instead of the floating gate, and a buried channel below the gate section 120 is continued from the channel in the charge transfer device. A $p^+$-type source region 121 and a $p^+$-type drain region 122 are provided to sandwich the channel in the direction perpendicular to the signal charge transfer direction.

By appropriately setting the level of a voltage $V_G$ of the gate section 120, a surface channel is formed in a surface region of an n-type semiconductor layer 125 below the gate section 120. The surface region is immediately below a surface of the semiconductor layer 125. The surface channel has an opposite polarity to that of the n-type semiconductor layer 125. The surface channel, the source region 121 and the drain region 122 are included in a P-MOS (metal-oxide-semiconductor) transistor. When a signal charge is accumulated in the buried channel in the n-type semiconductor layer 125 below the gate section 120, the potential of the surface channel changes. Such a potential is detected and output. In detail, as is shown in FIG. 15A, the drain region 122 of the P-MOS transistor is connected to a negative power source having a voltage of, for example, −15 V, and the source region 121 of the P-MOS transistor is connected to a positive power source having a voltage of, for example, +15 V via a resistor 123, and then a potential $V_S$ of the source region 121 is output via a buffer amplifier 124.

In the FSD 83 having the above-described structure, the buried channel acts as a conversion section for converting a signal charge into a voltage signal, and the P-MOS transistor including the surface channel and the source and the drain regions 121 and 122 acts as an amplifier. The conversion section and the amplifier are provided in an integrated manner.

As a second example of a charge detection device including a conversion section and an amplifier in an integrated manner, a charge detection device of a floating surface amplifier (hereinafter, referred to as "FSA") type described in Matsunaga, *High Sensitivity Charge Detectors for Charge Coupled Devices*, ITEJ Technical Report Vol. 13, No. 64, pp. 21–24, IPU '89-30 (December 1989) will be described with reference to FIGS. 16A and 16B. FIG. 16A is a cross sectional view of a charge detection device 84 of the FSA type, and FIG. 16B is a diagram illustrating the potential distribution in the depth direction of the charge detection device 84.

As is illustrated in FIG. 16A, the charge detection device 84 of the FSA type includes an n-type semiconductor layer 130 including a source region 133 and a drain region 134. A gate section 131 similar to the gate section 120 in terms of structure is provided sufficiently far from the n-type semiconductor layer 130, and a floating gate 132 is provided above and close to the n-type semiconductor layer 130. In such a structure, the capacitance of a signal accumulation section is significantly reduced, thereby enhancing the sensitivity of the charge detection device 84. A surface channel immediately below a surface of the semiconductor layer 130 of a detection section, the source and the drain regions 133 and 134 are included in a P-MOS transistor.

In the charge detection device 84, the semiconductor layer 130 below the floating gate 132 acts as a conversion section for converting a signal charge into a voltage signal, and the P-MOS transistor acts as an amplifier.

As a third example of a charge detection device including a conversion section and an amplifier in an integrated manner, a charge detection device of a floating well amplifier (hereinafter, referred to as "FWA") type also described in Matsunaga, *High Sensitivity Charge Detectors for Charge Coupling Devices*, ITEJ Technical Report Vol. 13, No. 64, pp. 21–24, IPU '89-30 (December 1989) will be described with reference to FIGS. 17A and 17B. FIG. 17A is a cross sectional view of a charge detection device 85 of the FWA type, and FIG. 17B is a diagram illustrating the potential distribution in the depth direction of the charge detection device 85.

As is illustrated in FIG. 17A, the charge detection device 85 of the FWA type includes an n-type semiconductor layer 140 including a source region 143 and a drain region 144. A gate section 141 similar to the gate section 120 in terms of structure is provided sufficiently far from the n-type semiconductor layer 140, and a floating gate 142 is provided above and close to the n-type semiconductor layer 140. In such a structure, the capacitance of a signal accumulation section is significantly reduced, thereby enhancing the sensitivity of the charge detection device 85. A channel in a p-well 145 below the n-type semiconductor layer 140, the source and the drain regions 143 and 144 are included in a P-MOS transistor.

In the charge detection device 85, the semiconductor layer 140 below the floating gate 142 acts as a conversion section for converting a signal charge into a voltage signal, and the P-MOS transistor acts as an amplifier.

As a fourth example of a charge detection device including a conversion section and an amplifier in an integrated manner, a charge detection device of a ring junction gate (hereinafter, referred to as "RJG") type described in Morimoto et al., *Low Noise Ring-Junction-Gate Amplifier for CCD Signal Charge Detection*, Lecture Notes on the ITEJ National Convention, pp. 27–28, (1989) will be described with reference to FIG. 18. FIG. 18 is a cross sectional view of a charge detection device 86 of the RJG type.

As is illustrated in FIG. 18, the charge detection device 86 of the RJG type includes no gate region or floating gate. A $p^+$-type source region 151 is provided in a middle part of a detection section.

In the charge detection device 86 having such a structure, an n-type layer 152 provided in a surface region of the detection section acts as a conversion section for converting a signal charge into a voltage signal, and a section including a p-well 153, the source region 151, and a $p^+$-type drain region 154 acts as an amplifier.

The charge detection devices of the FSD, FSA, FWA, and RJG types have the following problems in linearity and noise.

Linearity

First, problems from the view point of one dimensional function, namely, the function in the depth direction will be described.

Returning to FIG. 15D, the problems of the charge detection device 83 of the FSD type will be described.

Where the thickness of a spatial charge layer of a signal accumulation section S on the side of the surface of the charge detection device 83 is $d_1$, and the thickness of the spatial charge layer on the side of a substrate of the charge detection device 83 is $d_2$ (the thickness of the gate insulating film is calculated as a thickness of a film formed of a semiconductor material), a level of change $\Delta V_S$ of a surface potential $V_S$ caused by the quantity of change $\Delta Q_S$ of the signal charge $Q_{sig}$ is expressed by Equation (2). The surface potential $V_S$ is detected by the P-MOS transistor acting as the detection section. In Equation (2), $C_O$ is the capacitance of the gate insulating film per unit area, and $A_S$ is the area of the signal accumulation section S.

$$\Delta V_S = d_2/(d_1+d_2) \cdot (\Delta Q_S/(C_O A_S)) \quad (2)$$

Since $C_O$ and $A_S$ are considered to be constant, if $d_1 \ll d_2$, $\Delta V_S$ is substantially in proportion to $\Delta Q_S$.

In the case of the charge detection device 84 of the FSA type, as is shown in FIG. 16B, a level of change $\Delta V_S$ of the surface potential $V_S$ caused by the quantity of change $\Delta Q_S$ of the signal charge $Q_{sig}$ is expressed by Equation (2). If $d_1 \ll d_2$, $\Delta V_S$ is substantially in proportion to $\Delta Q_S$.

In the case of the charge detection device 85 of the FWA type, as is shown in FIG. 17B, where the thickness of an area of the spatial charge layer on the side of the substrate, the area between the most shallow point of the potential and the substrate is $d_3$, a level of change $\Delta V_S$ of a potential $V_S$ of the p-well 145 caused by the quantity of change $\Delta Q_S$ of the signal charge $Q_{sig}$ is expressed by Equation (3). In Equation (3), $K_1$ and $K_2$ are each a factor of proportionality.

$$V_S = K_1 \cdot (d_3)^2 \quad \Delta d_3 = K_2 \cdot d_1/(d_1+d_2) \cdot (\Delta Q_S/A_S) \tag{3}$$

The designation $\Delta d_3$, which is the level of change of $d_3$, is substantially in proportion to the quantity of change $\Delta Q_S$ of the signal charge $Q_{sig}$, but the level of change $\Delta V_S$ is not in proportion to $\Delta Q_S$.

The charge detection device 86 of the RJG type can be considered to include a gate electrode farther from the n-type layer 152 than in the charge detection device 85 of the FWA type. Accordingly, if $d_1 \gg d_2$ in Equation (3), the level of change $\Delta V_S$ is not in proportion to the quantity of change $\Delta Q_S$.

As is apparent from the above description, the charge detection devices of the FWA type and the RJG type are not satisfactory in linearity even if only from the view point of the depth direction.

Linearity from the view point of the two- or three-dimensional function, namely, in the planar directions will be described hereinafter.

Referring to, for example, FIG. 15B, the potential is deep in the detection section and becomes shallower in the surrounding area in a step-like manner. In actuality, however, as is represented by a solid line in FIG. 19B in relation with a cross sectional view of a conventional charge detection device (FIG. 19A), the potential in the surrounding area gradually changes due to the fringe field effect. Such effect of gradually changing the potential is referred to as the two-dimensional effect. The two-dimensional effect also acts in the direction perpendicular to the signal charge transfer direction. Thus, the potential distribution is represented by a cone-shaped potential well. For this reason, the area of the signal accumulation section is not constant, but increases as the charge increases. The dashed line in FIG. 19B represents an ideal box-shaped potential well.

The fringe field effect causing the two-dimensional effect is more conspicuous in the buried channel type charge detection devices in which the signal charge is accumulated far from the surface of the semiconductor layer than in the surface channel type charge detection devices in which the signal charge is accumulated in the surface region of the semiconductor layer. The reason is that the coupling of the capacitances of the signal charge and the gate electrode are weaker in the buried channel type devices than in the surface channel type devices.

The charge detection devices of the FSD, FSA, FWA and RJG types are all of the buried channel type, and the signal charge is accumulated in an area where a charge is transferred. The linearity in such conventional charge detection devices including a conversion section and an amplifier in an integrated manner is reduced by the two-dimensional effect.

Noise

In the charge detection devices including a conversion section and an amplifier in an integrated manner, the buried channel is completely depleted when a signal charge is transferred from the detection section by a reset operation. Accordingly, no reset noise is generated.

In the charge detection devices of the FWA and RJG types, the channel of the P-MOS transistor is a p-well, namely, buried. Accordingly, the P-MOS transistor as an amplifier is not influenced by the interface level, and thus generates low noise. In the charge detection devices of the FSD and FSA types, the channel of the P-MOS transistor is in the surface region of the semiconductor layer, and thus is influenced by the interface level, thereby generating high noise.

As has been described so far, the charge detection devices of the FSD and FSA types have satisfactory one-dimensional linearity but generate high noise. The charge detection devices of the FWA and RJG types generate low noise but have low one-dimensional linearity. The charge detection devices of all the four types have low two-dimensional linearity.

SUMMARY OF THE INVENTION

A charge detection device according to the present invention for converting a signal charge consisting of carriers of a first polarity externally provided into a voltage signal, the charge detection device includes a MOS transistor, the MOS transistor having: a first semiconductor layer having a transistor channel for carriers of a second polarity; an insulating layer provided on the first semiconductor layer; and a gate electrode provided on the insulating layer, wherein transistor characteristics of the MOS transistor are changed by the signal charge accumulated in a surface region of the first semiconductor layer immediately below an interface between the first semiconductor layer and the insulating layer, thereby detecting a quantity of the signal charge.

In one embodiment of the invention, the MOS transistor further includes a semiconductor substrate of a first conductivity type, and the first semiconductor layer is formed in the semiconductor substrate and has a second conductivity type.

In one embodiment of the invention, the MOS transistor further includes a source region, a drain region, and a channel region, the source region and the drain region are formed in surface regions of the first semiconductor layer and have a first conductivity type, and the channel region is provided between the source region and the drain region.

In one embodiment of the invention, a reverse bias voltage is applied across the semiconductor substrate and the drain region, the gate electrode is applied with a prescribed voltage to form a channel potential which accumulates the signal charge at the surface of the channel region and provides a transistor channel below the surface of the channel region, and the source region is connected to a power source via a load, thereby detecting the quantity of the signal charge.

In one embodiment of the invention, the charge detection device further includes a charge input section, the charge input section including: a second semiconductor layer provided in a surface region of the first semiconductor layer in contact with the channel region and having the second conductivity; and an input gate electrode provided above the second semiconductor layer with another insulating layer sandwiched therebetween for controlling an input of the signal charge to the channel region.

In one embodiment of the invention, the drain region includes a first sub-region and a second sub-region opposed to each other both in contact with the charge input section, and the source region is provided between the first and the second sub-regions in the state of being isolated from the charge input section.

In one embodiment of the invention, the drain region includes a first sub-region and a second sub-region opposed to each other both in contact with the charge input section, and the source region is provided at a center of a region substantially surrounded by the charge input section and the first and the second sub-regions.

In one embodiment of the invention, the gate electrode has a shape surrounding the source region.

In one embodiment of the invention, a reverse bias voltage is applied across the semiconductor substrate and the drain region, the gate electrode is applied with a prescribed voltage to form a channel potential which accumulates the signal charge at the surface of the channel region and provides a transistor channel below the surface of the channel region, and the source region is connected to a power source via a load, thereby detecting the quantity of the signal charge in accordance with a timing of applying a voltage with the input gate electrode.

In one embodiment of the invention, the charge detection device further includes a reset section, the reset section including: a third semiconductor layer having the second conductivity type and provided in a surface region of the first semiconductor layer in contact with the channel region and isolated from the second semiconductor layer; and a reset gate electrode provided above the third semiconductor with still another insulating layer sandwiched therebetween.

In one embodiment of the invention, a reverse bias voltage is applied across the semiconductor substrate and the drain region, the gate electrode is applied with a prescribed voltage to form a channel potential which accumulates the signal charge at the surface of the channel region and provides a transistor channel below the surface of the channel region, and the source region is connected to a power source via a load, thereby detecting the quantity of the signal charge in accordance with a timing of applying a voltage with the reset gate electrode.

In one embodiment of the invention, a path in which the signal charge is transferred and the transistor channel of the MOS transistor run in directions crossing each other, in the state of being isolated from each other in the depth direction.

In another aspect of the invention, a method for producing a charge detection device includes the steps of: forming the insulating layer on the first semiconductor layer; forming the gate electrode on the insulating layer; and implanting an impurity having a second conductivity to a surface region of the first semiconductor layer to form a second semiconductor layer and a third semiconductor layer, using the gate electrode as a mask, in self alignment with the gate electrode.

In still another aspect of the invention, a method includes the steps of: forming a semiconductor film having a second conductivity on the first semiconductor layer; forming an insulating layer on the semiconductor film; forming the input gate electrode and the reset gate electrode on the insulating layer; and implanting an impurity having the first conductivity into the semiconductor film to form a second semiconductor layer and a third semiconductor layer both having the second conductivity and a channel region having the first conductivity between the second and the third semiconductor layers, using the input gate electrode and the reset gate electrode as masks, in self alignment with the input gate electrode and the reset gate electrode.

In still another aspect of the invention, a charge transfer and detection apparatus includes: a charge transfer device for transferring a signal charge consisting of carriers of a first polarity; and a charge detection device for converting the signal charge provided by the charge transfer device into a voltage signal, wherein the charge detection device includes a MOS transistor having: a first semiconductor layer having a transistor channel for carriers of a second polarity; an insulating layer provided on the first semiconductor layer; and a gate electrode provided on the insulating layer, and wherein transistor characteristics of the MOS transistor are changed by the signal charge accumulated in a surface region of the first semiconductor layer immediately below an interface between the first semiconductor layer and the insulating layer, thereby detecting a quantity of the signal charge.

In one embodiment of the invention, the charge transfer device and the charge detection device are provided on a single semiconductor substrate.

In a charge detection device according to the present invention, a surface region of a semiconductor layer provided on a substrate, the surface region acting as a detection section, is used as a conversion section for converting a signal charge into a voltage signal, and a MOS transistor having a buried channel in the semiconductor layer is used as an amplifier.

The relationship among the gate voltage of the MOS transistor, the voltage of the semiconductor layer and the voltage of a substrate is appropriately set so that the quantity of the current flowing through the buried channel of the MOS transistor can change in accordance with the quantity of the signal charge accumulated in the surface region of the MOS transistor, thus to detect the quantity of the signal charge. Considered in the depth direction, the gain of conversion of a signal charge to a voltage signal is substantially constant, and thus satisfactory linearity can be obtained. Since the signal charge is accumulated in the surface region of the MOS transistor, the two-dimensional effect is restricted, and thus the linearity is further improved.

Since the signal charge accumulated in the surface region of the MOS transistor, the surface region acting as the detection section, is completely transferred by reset operation, theoretically no reset noise is generated. Since the buried channel of the MOS transistor for amplifying the current is buried, generation of noise by amplification is also restricted.

Since the amplifier is integrated with the detection section, separate wires or driving transistors are not necessary. Accordingly, capacitance of the detection section can be kept low. Due to such a structure, by appropriately selecting the area of the detection section of the MOS transistor, the gain of conversion of a signal charge into a voltage signal can be sufficiently enhanced, and the amount of signals which can be handled is sufficiently increased. Such a charge detection device can be easily produced.

A charge transfer and detection device has such a charge detection device and a charge transfer device on the same substrate. In this state, the charge detection device has the same effects.

In a method for producing a charge detection device according to the present invention, an end of a gate electrode is aligned with an end of an impurity region of a charge input section, and the other end of the gate electrode is aligned with an end of an impurity region of a reset gate section in a self alignment manner. Also, an end of the surface channel region between the impurity regions is aligned with an input gate electrode and the other end of the surface channel region is aligned with a reset gate electrode in a self alignment manner.

Thus, the invention described herein makes possible the advantages of providing (1) a charge detection device including a conversion section and an amplifier in an integrated manner, having high sensitivity and high linearity and generating low noise, (2) a method for producing such a charge detection device for aligning an end of a surface channel of a detection section and an end of a gate electrode, and (3) a charge transfer and detection apparatus including such a charge detection device combined with a charge transfer device.

These and other advantages of the present invention will become apparent to those skilled in the art upon reading and understanding the following detailed description with reference to the accompanying figures.

BRIEF DESCRIPTION OF THE DRAWINGS

FIG. 4A is a diagram illustrating the potential distribution of the charge detection device shown in FIG. 1A in the case when the gate voltage and the substrate voltage are appropriate relative to the p-well voltage.

FIG. 4B is a diagram illustrating the potential distribution of the charge detection device shown in FIG. 1A in the case when the gate voltage is appropriate but the substrate voltage is too low relative to the p-well voltage.

FIG. 4C is a diagram illustrating the potential distribution of the charge detection device shown in FIG. 1A in the case when the gate voltage and the substrate voltage are too low relative to the p-well voltage.

FIG. 4D is a graph illustrating the dynamic range of the detection section with respect to a signal in the case of FIGS. 4A through 4C.

FIGS. 7(1)A through 7(4)A and 7(1)B through 7(4)B are cross sectional views illustrating each of a series of steps of a method for producing the charge detection device shown in FIG. 1A.

FIG. 8 is a diagram illustrating the concentration of each of the layers in the charge detection device produced by the production method shown in FIGS. 7(1)A through 7(4)A and 7(1)B through 7(4)B.

FIGS. 9(1)A through 9(5)A and 9(1)B through 9(5)B are cross sectional views illustrating each of a series of steps of another method for producing the charge detection device shown in FIG. 1A.

DESCRIPTION OF THE PREFERRED EMBODIMENTS

Hereinafter, the present invention will be described by way of illustrative examples with reference to the accompanying drawings.

Figure 1A:
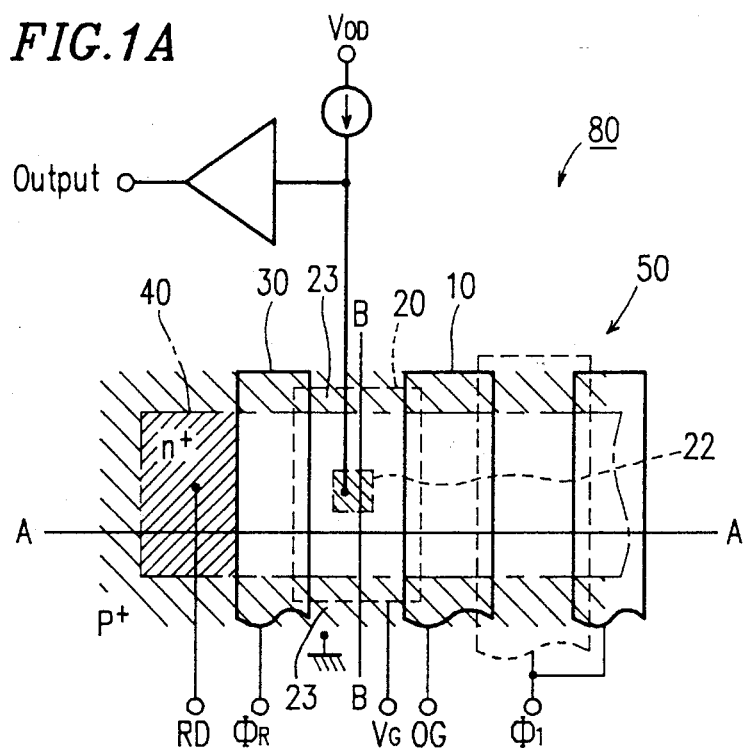
FIG. 1A is a schematic top view of a charge detection device in an example according to the present invention.

With reference to FIGS. 1A through 6, a charge detection device in an example according to the present invention will be described. FIG. 1A is a schematic top view of a charge detection device 80 in accordance with the first example, FIG. 1B is a cross sectional view of the charge detection device 80 taken along line A—A in FIG. 1A, and FIG. 1C is a cross sectional view of the charge detection device 80 taken along line B—B in FIG. 1A. In FIG. 1A, the dashed lines indicate lower electrodes and the solid lines indicate upper electrodes.

The charge detection device 80 is located downstream relative to a transfer clock section 50 which is an end part of a CCD acting as a charge transfer device and receives a transfer clock signal $\phi_1$. The transfer clock section 50 includes gate electrodes 51 and 52, and a portion of an n-type layer 3 and a portion of a p-well 2 both in correspondence with the gate electrodes 51 and 52. The charge detection device 80 includes a charge input section 10 for receiving an input gate signal OG, a detection section 20 for receiving a detection gate signal $V_G$, a reset gate section 30 for receiving a reset gate signal $\phi_R$, and a reset drain section 40 for receiving a reset drain signal RD located in this order in the direction in which a signal charge is transferred. The charge input section 10 is provided in order to prevent influence of clocking based on the transfer clock signal $\phi_1$ output by the CCD and to prevent a charge from flowing in a reverse direction, but is not absolutely necessary. For example, in the case that an output stage of the CCD includes a substitute for the charge input section 10, the charge detection device 80 is not influenced by the clocking or the charge does not flow in a reverse direction even without the charge input section 10. In such a case, the charge input section 10 can be omitted.

Figure 1B:
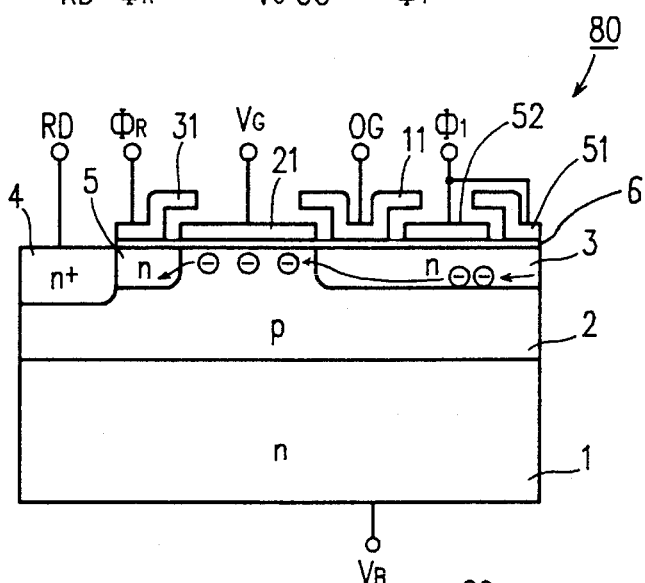
FIG. 1B is a cross sectional view of the charge detection device shown in FIG. 1A along line A—A in FIG. 1A.

As is shown in FIG. 1B, on an n-type substrate 1, the p-well 2 acting as a first semiconductor layer is provided. On the p-well 2, the n-type layer 3 acting as a second semiconductor layer, an n-type layer 5 acting as a third semiconductor layer, and an n$^+$-type layer 4 acting as a fourth semiconductor layer are provided. On the semiconductor layers 2, 3, 4 and 5, gate electrodes of the above-mentioned elements are provided via an insulating layer 6. In detail, the gate electrodes 51 and 52 of the transfer clock section 50 of the charge transfer device, an input gate electrode 11 of the charge input section 10, a gate electrode 21 of the detection section 20, and a reset gate electrode 31 of the reset gate section 30 are provided. A transfer channel of the charge detection device 80 is in the surface region thereof in the detection section 20 since no n-type layer is provided, and buried in the transfer clock section 50, the charge input section 10 and the reset gate section 30. In the buried channel, a signal charge consisting of electrons is transferred, as shown by arrows in FIG. 1B.

Figure 1C:
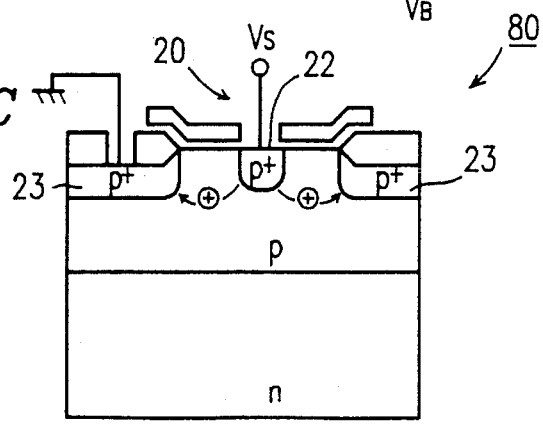
FIG. 1C is a cross sectional view of the charge detection device shown in FIG. 1A along line B—B in FIG. 1A.

As is shown in FIG. 1C, a source region 22 formed of a p$^+$-type layer is located at a central area of the detection section 20. A drain region 23 formed of a p$^+$-type layer is located below an isolation region along a perimeter of the detection section 20. The source region 22, the drain region 23 and the gate electrode 21 form a P-MOS transistor. The n-type substrate 1 is supplied with a positive voltage $V_B$, and the p-well 2 is supplied with a grounding voltage (0 V) via the drain region 23. According to the present invention, the potential of the source region 22 is not fixed to any particular level but is kept floating. Such a state is easily realized by surrounding the source region 22 by the drain region 23 as is shown in FIGS. 1A and 1C. In such a structure, it is preferable to provide the gate electrode 21 around the source region 22. In this manner, the surface channel is enlarged, and thus the sensitivity of the charge detection device 80 is raised.

Figure 2A:
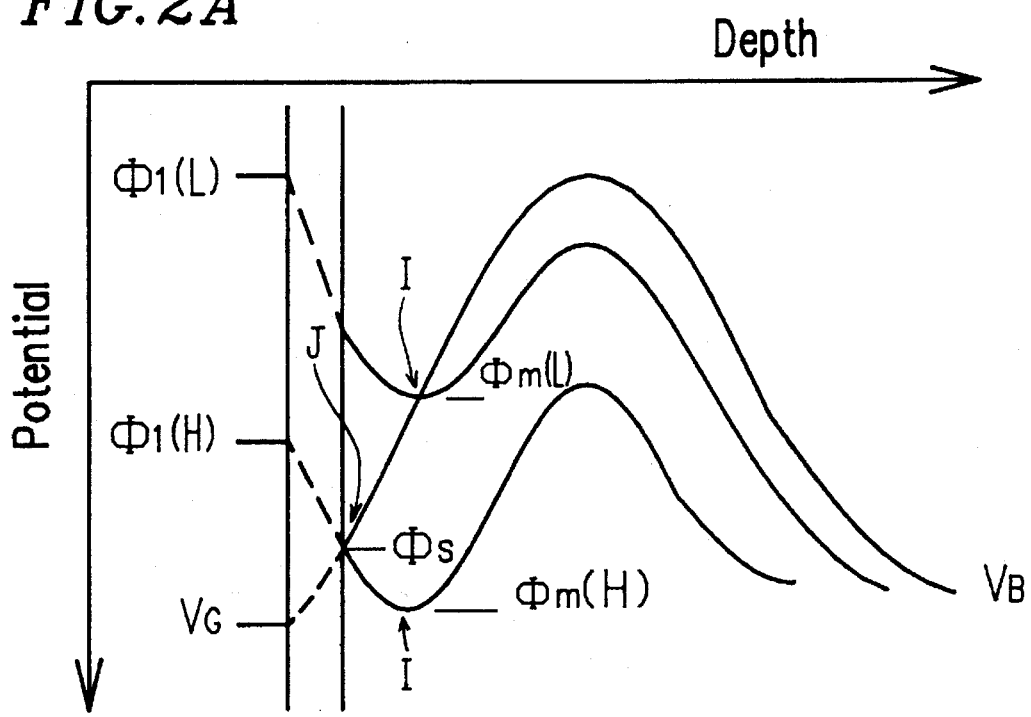
FIG. 2A is a diagram illustrating the potential distribution of the charge detection device shown in FIG. 1A in the depth direction.

FIG. 2A shows the potential distributions in the depth direction of both the transfer clock section 50 and the detection section 20. Such potential distributions are obtained by appropriately selecting the concentration distribution of the p-well 2, the n-type layers 3 and 5, and the n$^+$-type layer 4, and the low and high levels of the clock voltage $\phi_1$ and the level of the gate voltage $V_G$. As shown in FIG. 2A, the signal charge is accumulated at points I in the transfer section 50 and at a point J in the detection section 20. Therefore, the transfer section 50 and the detection section 20 are referred to as a buried channel and a surface channel, respectively.

Figure 2B:
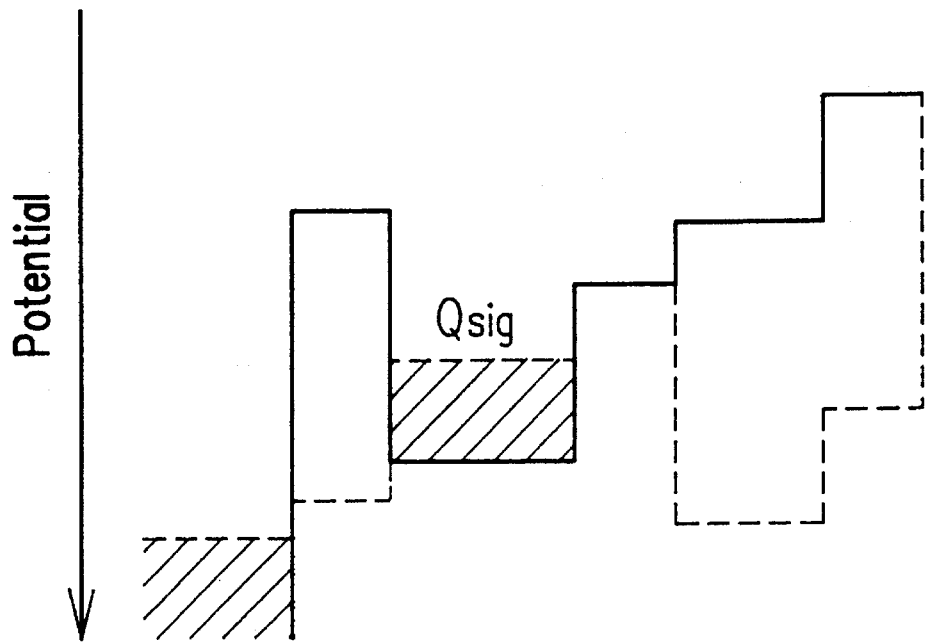
FIG. 2B is a diagram illustrating the potential distribution of the charge detection device shown in FIG. 1A in the signal charge transfer direction.

FIG. 2B is a potential distribution diagram of the charge detection device 80 in the signal charge transfer direction. FIG. 2B is obtained by plotting the deepest potential points $\phi_m$ (Low) and $\phi_m$ (High), $\phi_S$, and the like below the gate electrodes 11, 21, 31, 51 and 52. Thus, the signal charge $Q_{sig}$ accumulated in the detection section 20 can be transferred to the reset drain region 40 completely, and thus reset noise can be eliminated.

Figure 3:
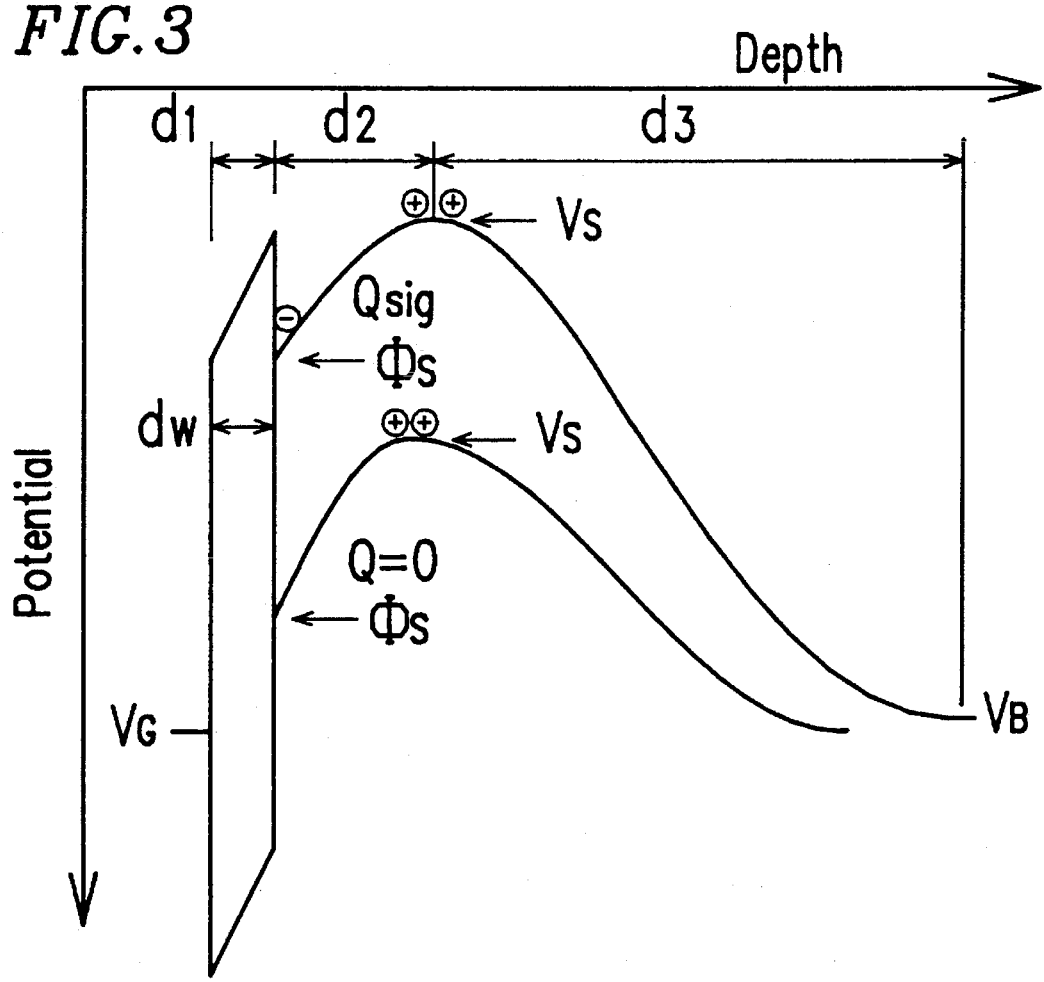
FIG. 3 is a diagram illustrating the potential distribution of a detection section of the charge detection device shown in FIG. 1A in the depth direction.

FIG. 3 shows the potential distribution of the detection section 20 in the depth direction. The signal charge consisting of electrons are accumulated at the interface between the semiconductor layer 2 and the insulating layer 6. Since the detection section 20 is formed of the P-MOS transistor, the potential $V_S$ in FIG. 3 is the buried channel potential of the P-MOS transistor. The buried channel potential $V_S$ changes in accordance with the quantity of the signal charge $Q_{sig}$.

As shown in FIG. 1A, according to the invention, the drain region 23 (p$^+$-type layer) is grounded, and the source region 22 (p$^+$-type layer) is connected to a positive power source $V_{OD}$ via a load acting as a source of a constant current for a channel conductance of the P-MOS transistor. In the case, a transistor current caused by holes flows in the p-well 2, as shown by arrows in FIG. 1C. The path of the transistor current is positioned at the top of the buried channel potential shown in FIG. 3. The top is below the surface of the p-well 2 by a distance of d2. Therefore, the p-well 2 is referred to as the buried channel for a transistor current caused by holes. As is apparent from the FIGS. 1B, 1C, and 3, the path in which the signal charge is transferred and the transistor channel of the MOS transistor run in directions crossing each other, in the state of being isolated from each other in the depth direction.

When the signal charge is accumulated at the surface of the p-well 2 and the buried channel potential $V_S$ is changed, the channel conductance also changes in accordance with the change in the buried channel potential $V_S$. Since the transistor current is set to be constant, the potential of the source region 22 changes in accordance with the change in the channel conductance. Thus, the change in the quantity of the signal charge $Q_{sig}$ accumulated in the surface region of the detection section 20 is detected as the change in the potential of the source region 22.

Especially in the configuration explained above, the potential of the source region 22 equals the buried channel potential $V_S$ and thus is used as an output signal. In actuality, a level of change $\Delta V_S$ of the buried channel potential $V_S$ from the time when no signal charge is accumulated is used as an output signal. Since the channel of the P-MOS transistor for current amplification is buried, such a channel is not influenced by the interface between the semiconductor layer 2 and the insulating layer 6, thereby generating low noise.

As a result, elimination of reset noise and reduction of noise are both realized in the charge detection device 80.

In the operation of the detection section 20, it is important to appropriately set the relationship among the gate voltage $V_G$, the voltage $V_{PW}$ of the p-well 2 (=0 V) and the voltage $V_B$ of the n-type substrate 1 so that the current flowing through the buried channel between the source region 22 and the drain region 23 can change in accordance with the quantity of the signal charge $Q_{sig}$ accumulated in the surface region of the detection section 20. In the case that the gate voltage $V_G$ and the substrate voltage $V_B$ are appropriately set relative to the p-well voltage $V_{PW}$, the potential distribution is as represented by curves (1) and (2) in FIG. 4A when the quantity of the signal charge $Q_{sig}$ is normal. Only in the case when the quantity of the signal charge $Q_{sig}$ is extremely great, the p-well 2 is neutralized and thus the buried channel potential $V_S$ does not change as is represented by curve (3) in FIG. 4A.

In the case the gate voltage $V_G$ is appropriate but the substrate voltage $V_B$ is too low relative to the p-well voltage $V_{PW}$, the potential distribution is as represented by curves (1) and (2) in FIG. 4B when the quantity of the signal charge $Q_{sig}$ is normal. In the case both the gate voltage $V_G$ and the substrate voltage $V_B$ are too low relative to the p-well voltage $V_{PW}$, the potential distribution is as represented by curves (1) and (2) in FIG. 4C when the quantity of the signal charge $Q_{sig}$ is normal. In these two cases, the p-well 2 is neutralized to stop the change of the buried channel potential $V_S$ at a lower quantity of the signal charge $Q_{sig}$ than in the case shown in FIG. 4A. In other words, as is shown in FIG. 4D, the dynamic range of the detection section 20 relative to the signal is lowered. In more detail, the range of $\Delta V_S$ changing in proportion to the quantity of the signal charge $Q_{sig}$ is largest in the case shown in FIG. 4A, second largest in the case shown in FIG. 4B, and smallest in the case shown in FIG. 4C.

According to the present invention, the relationship among the gate voltage $V_G$, the p-well voltage $V_{PW}$ (=0 V) and the substrate voltage $V_B$ are appropriately set so that the quantity of the current flowing through the buried channel between the source region 22 and the drain region 23 can change in accordance with the quantity of the signal charge $Q_{sig}$. In this manner, the signal charge is detected.

The quantitative relationship between the buried channel potential $V_S$ and the quantity of the signal charge $Q_{sig}$ will be described, hereinafter.

Where the dielectric constant of the insulating layer is $\xi_O$, the dielectric constant of the semiconductor layer is $\xi_S$, the thickness equivalent to the thickness $d_O$ of the insulating layer is $d_1 = (\xi_S/\xi_O) \cdot d_O$, the position of the bottom of the potential well of the p-well 2 relative to the surface of the charge detection device 80 is $d_2$, the position of the n-type substrate 1 relative to the bottom of the potential well of the p-well 2 is $d_3$ (FIG. 3), the gate capacitance per a unit area is $C_O (=\xi_O/d_O)$, and the area of the signal accumulation section is $A_S$, the level of change $\Delta V_S$ of the channel potential in accordance with the quantity of change $\Delta Q_S$ of the signal charge $Q_{sig}$ is expressed by Equation (4).

$$\Delta V_S = G \cdot (\Delta Q_S/(C_O A_S)) \text{ where } G = d_3/(d_1+d_2+d_3) \tag{4}$$

Figure 5:
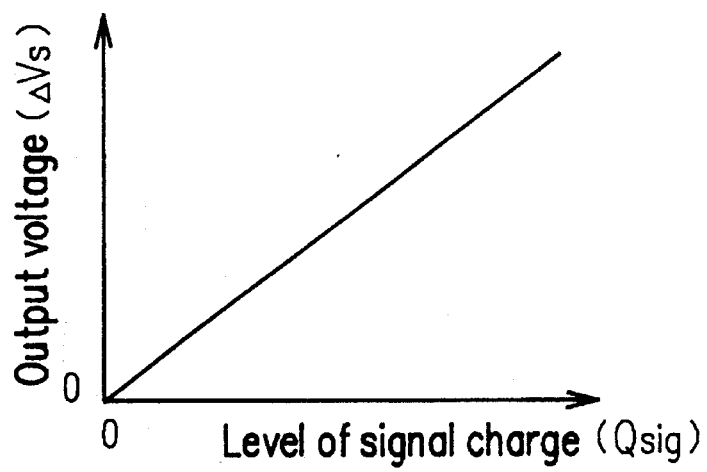
FIG. 5 is a graph illustrating a characteristic of conversion of a signal charge into a voltage signal.

Generally, $d_3 \gg d_1, d_2$. Accordingly, G is approximate to a constant value approximate to "1". As is shown in FIG. 5, $\Delta V_S$ is substantially in proportion to $\Delta Q_S$.

The above principle will be proven by the following example. The semiconductor is silicon.

$$\left.\begin{array}{l}\text{Concentration of the n-type substrate} \\ N_B = 2 \times 10^{14} \text{cm}^{-3} \\ \text{Concentration of the p-well} \\ N_P = 5 \times 10^{15} \text{cm}^{-3} \\ \text{Thickness of the p-well} \\ X_P = 1.8 \text{ }\mu\text{m} \\ \text{Thickness of the insulating layer} \\ d_0 = 80 \text{ nm}\end{array}\right\} \tag{5}$$

Where the substrate voltage $V_B$=10 V, the gate voltage $V_G$=15 V, and the signal density is $q_{sig}(=Q_{sig}/S_G)$, when $q_{sig}=0$, $$\left.\begin{array}{l}\phi_S = 12.01 \text{ V (see FIG. 2A for }\phi_S\text{)} \\ V_S = 3.55 \text{ V} \\ d_1 = 0.24 \text{ }\mu\text{m} \\ d_2 = 1.29 \text{ }\mu\text{m} \\ d_3 = 6.87 \text{ }\mu\text{m}\end{array}\right\} \tag{6}$$

When $q_{sig}=10^{12}$el/cm$^2$, $$\left.\begin{array}{l}\phi_S = 8.3 \text{ V} \\ V_S = 0.46 \text{ V} \\ d_1 = 0.24 \text{ }\mu\text{m} \\ d_2 = 1.24 \text{ }\mu\text{m} \\ d_3 = 8.25 \text{ }\mu\text{m}\end{array}\right\} \tag{7}$$

The constant G for fixing the one-dimensional linearity is, based on Equation (4), $$\text{when } q_{sig}=0, G=0.82 \text{ when } q_{sig}=10^{12}\text{el/cm}^2, G=0.85 \tag{8}$$

Thus, there is no practical problem in the linearity.

Where the area $S_G$ of the gate of the detection section 20 is $S_G$=10 $\mu$m$^2$, and the number of the electrons generating the signal charge is $N_{sig}\{=Q_{sig}/q$ (q: charge of an electron))}, $q/(C_O A_S)=38$ $\mu$V/el.
Accordingly, $$\Delta V_S/N_{sig}=31 \text{ to } 32 \text{ }\mu\text{V/el} \tag{9}$$

The gain obtained by Equation (9) is much higher than 15 to 20 $\mu$V/el, which is the highest gain which has conventionally been obtained in the field of the charge detection devices of the FDA type.

The operation of the charge detection device 80 according to the present invention has been described from the view point of a one dimensional function. In practice, the operation should be considered with the two-dimensional effect. The designation $A_S$ in Equation (4) is not constant, but changes in accordance with the quantity of the signal charge $Q_{sig}$. Nevertheless, since the signal charge is accumulated in the surface channel of the charge detection device 80, the two-dimensional effect is significantly reduced compared with the case of the devices in which the signal charge is accumulated in the buried channel.

Figure 6A:
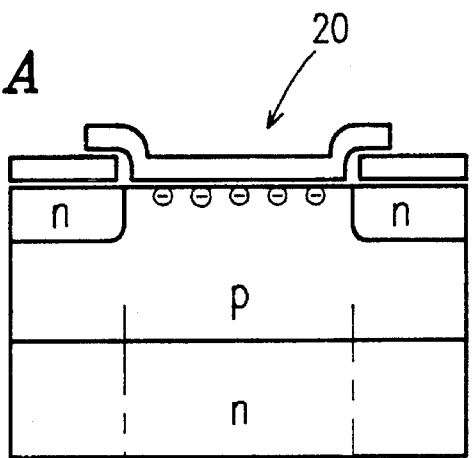
FIGS. 6A and 6B are views showing restriction of the two-dimensional effect in the charge detection device according to the present invention.
Figure 6B:
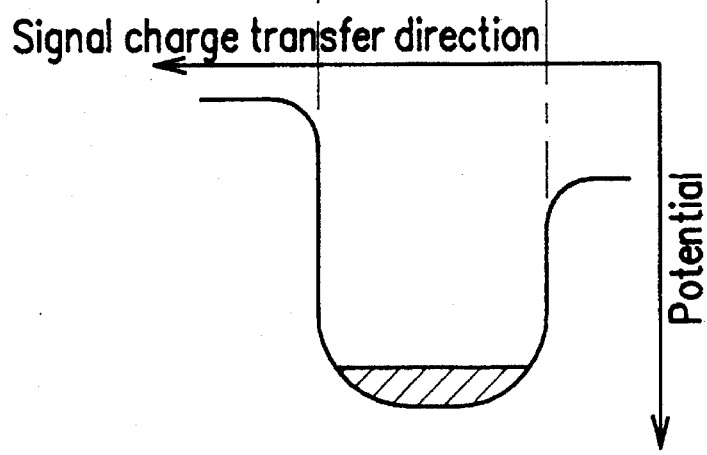

FIG. 6A is a cross sectional view of the charge detection device 80, and FIG. 6B schematically shows the potential well thereof. Since the signal charge is accumulated in the surface channel as is shown in FIG. 6A, the bottom of the potential well (FIG. 6B) is flat with the two-dimensional effect being restricted. Accordingly, the linearity of the charge detection device 80 according to the present invention is higher than that of the conventional devices. This is because the coupling of the capacitances of the signal charge and the gate electrode are stronger in the surface channel type devices than in the buried channel type devices.

In the charge detection device 80 according to the present invention, a charge is transferred in the surface region of the semiconductor layer only in the detection section 20 as will be described in detail, hereinafter.

First, a charge remaining without being transferred will be described. A charge trapped at the surface level $N_{SS}$ is transferred during time t. The level N(t) of the charge transferred during time t is expressed by Equation (10) (see C. H. Sequin and M. F. Tompsett, *Charge Transfer Devices*, Academic Press, §IV-B-5, Equation (4.59) (1975)).

$$N(t)=k \cdot T \cdot A_S \cdot N_{SS} \cdot \ln(t/t_O) \quad t_O=8 \times 10^{-12} \text{sec.} \tag{10}$$

wherein k is a constant, and T is the absolute temperature.

The quantity of the charge left without being transferred depends on the length of the period in which no signal is provided. The quantity of the charge N transferred when a cycle of the period in which a signal is provided and a period in which no signal is provided is repeated 10 times is obtained from Equation (10). Since $N_{SS}$ is in the order of $10^9 \text{cm}^{-2} \text{eV}^{-1}$ by the current semiconductor technology, $N_{SS}=5\times10^9\text{cm}^{-2}\text{eV}^{-1}$ and $A_S=10 \text{ }\mu\text{m}^2$. The quantity of the charge N transferred is N(10Tc) - N(Tc)≈30 el. Such a level is negligible in consideration of the usual quantity of signal charge of ~$10^4$ el. The designation Tc is the transfer clock period.

Next, noise generated by signal charge transfer via the surface channel will be described. The transfer noise $\Delta N_{SS}$ by the surface level $N_{ss}$ is expressed by Equation (11) since the transfer is performed once for each signal packet (see C. H. Sequin and M. F. Tompsett, *Charge Transfer Devices*, Academic Press, §IV-C-1, Equation (4.73) (1975)).

$$\Delta N_{SS}=\sqrt{(k \cdot T \cdot A_S \cdot N_{SS} \cdot \ln 2)} \tag{11}$$

Where the values of $N_{SS}$ and $A_S$ are the same as above, the transfer noise $\Delta N_{ss} \approx 3$ el. This figure is sufficiently lower than several tens of el, which is the level of noise generated in the amplification circuit of the conventional charge detection devices having a surface channel structure.

In a charge detection device including a conversion section and an amplifier according to the present invention, high sensitivity, high linearity and low noise can be realized.

With reference to FIGS. 7(1)A through 7(4)A and 7(1)B through 7(4)B, a method for producing such a charge detection device will be described. FIGS. 7(1)A through 7(4)A are cross sectional views of each of a series of fabrication steps taken along line A—A in FIG. 1A. FIGS. 7(1)B through 7(4)B are cross sectional views of each of these fabrication steps taken along line B—B in FIG. 1A.

Briefly returning to FIG. 1B, an end of the n-type layer 3 and an end of the gate electrode 21 of the detection section 20 is aligned with each other. It is desirable to form the n-type layer 3 and the gate electrode 21 by self-alignment to realize such alignment. In order to produce a charge transfer and detection apparatus including a charge transfer device and a charge detection device, formation of the source region 22 and the drain region 23 should be added to the usual production process of a charge transfer device.

As is shown in FIGS. 7(1)A and 7(1)B, the p-well 2 is formed in a surface region of the n-type substrate 1, and then a nitride film 61 having a pattern is formed on the n-type substrate 1. Next, as is shown in FIG. 7(1)B, a high concentration $p^+$ layer 62 is formed in the p-well 2 by ion implantation using the nitride film 61 as a mask. The high concentration $p^+$ layer 62 will act as the drain region 23 of the P-MOS transistor.

Next, as is shown in FIG. 7(2)B, a LOCOS film 63 is formed using the nitride film 61 as a mask, and then the nitride film 61 is removed.

After a gate insulating film 6 is formed, the gate electrode 21 of the detection section 20 is formed on the gate insulating film 6 as is shown in FIG. 7(2)A.

As is shown in FIG. 7(2)B, a resist pattern 64 is formed on the gate electrode 21, and then the n-type layers 3 and 5 are formed by ion implantation using the gate electrode 21 and the resist pattern 64 as masks. In this manner, an end of the gate electrode 21 and an end of the n-type layer 3 can be aligned with each other, and the other end of the gate electrode 21 and an end of the n-type layer 5 can also be aligned with each other. By such structure, generation of a potential barrier or dip at the end of the gate electrode 21 can be restricted, and thus the charge is completely transferred with no part thereof being left.

Next, as is shown in FIG. 7(3)A, the gate electrode 52 of the transfer clock section 50 is formed on the n-type layer 3, and then the gate electrode 51 also of the charge clock section 50, the input gate electrode 11 of the charge input section 10, and the reset gate electrode 31 of the reset gate section 30 are formed. Then, a resist pattern 68 is formed so as to partially cover the reset gate electrode 31. As is shown in FIG. 7(3)B, the source region 22 is formed by $p^+$ ion implantation using the gate electrodes 11, 21, 31, 51 and 52 and the resist pattern 68 as masks.

As is shown in FIGS. 7(4)A and 7(4)B, after removing the resist pattern 68, a resist pattern 70 is formed so as to cover the source region 22. The $n^+$-type layer 4 of the reset drain section 40 is formed by ion implantation using the gate electrodes 11, 21, 31, 51 and 52 and the resist pattern 70 as masks.

In this manner, the charge detection device 80 in which an end of the gate electrode 21 and an end of the n-type layer 3, and the other end of the gate electrode 21 and an end of the n-type layer 5 are aligned with each other is produced. By providing such a charge detection device 80 on the same substrate as a charge transfer device, a charge transfer and detection device is produced.

In order to obtain the n-type layer 3 fulfilling the conditions that:

when $\phi_1$ (Low)=0 V, $\phi_m$=7.1 V, $V_S$=1.4 V when $\phi_1$ (High)=5 V, $\phi_m$=11.8 V, $V_S$=5.4 V (12)

based on Equation (5), the n-type layers 3 and 5 should be formed to fulfill the conditions of:

concentration of the n-type layer $N_N=8 \cdot 10^{16} \text{cm}^{-3}$ thickness of the n-type layer $X_N=0.25$ µm (13)

This state is shown in FIG. 8. In FIG. 8, $X_p$ designates the border between the n-type substrate 1 and the p-well 2. The detection section 20 has the concentration $N_B$ on the side of the n-type substrate 1 relative to the border $X_p$, and has the concentration of $N_p$ (>$N_B$) on the side of the p-well 2 relative to the border $X_p$. The transfer clock section 50 has the concentration of $N_B$ on the side of the n-type substrate 1 relative to the border $X_p$. On the side of the p-well 2 relative to the border $X_p$, the layer is of the p-type and the concentration is $N_p$ from depth $X_p$ to $X_N$, and the layer is of the n-type and the concentration is $N_N$ from depth 0 to $X_N$. The concentration $N_N$ is higher than the concentration $N_p$. The above-described conditions can easily be realized by the method shown in FIGS. 7(1)A through 7(4)A and 7(1)B through 7(4)B.

Referring to FIGS. 9(1)A through 9(4)A and 9(1)B through 9(5)B, another method for producing the charge detection device 80 will be described. FIGS. 9(1)A through 9(5)A are cross sectional views of each of a series of fabrication steps taken along line A—A in FIG. 1A. FIGS. 9(1)B through 9(5)B are cross sectional views of each of a series of fabrication steps taken along line B—B in FIG. 1A.

As is shown in FIGS. 9(1)A and 9(1)B, the p-well 2 is formed in a surface region of the n-type substrate 1, and then a nitride film 61 having a pattern is formed on the n-type substrate 1. Next, as is shown in FIG. 9(1)B, a high concentration $p^+$ layer 62 is formed in the p-well 2 by ion implantation using the nitride film 61 as a mask. The high concentration $p^+$ layer 62 will act as the drain region 23 of the P-MOS transistor.

Next, as is shown in FIGS. 9(2)A and 9(2)B, a LOCOS film 63 is formed using the nitride film 61 as a mask, and then the nitride film 61 is removed. Then, an n-type layer 64 is formed in the p-well 2 by ion implantation.

After a gate insulating film 6 is formed, as is shown in FIGS. 9(3)A, a gate electrode 52 of the transfer clock section 50 is formed on the n-type layer 64, and then a gate electrode 51 also of the transfer clock section 50 and an input gate electrode 11a of the charge input section 10 are formed. A reset gate electrode 31a of the reset gate section 30 is formed on the n-type layer 64. Then, a resist pattern 8 is formed so as to partially cover the gate electrode 31a. As is shown in FIG. 9(3)B, p-type ions are implanted into the n-type layer 64 using the gate electrodes 51, 52, 11a and 31a and the resist pattern 8 as masks, thereby turning an area of the n-type layer 64 in the detection section 20 into a p-type region 65. In this manner, an end of the p-type region 65 is aligned with the input gate electrode 11a, and the other end of the p-type region 65 is aligned with the reset gate electrode 31a both in a self aligned manner. By the formation of the p-type region 65, the n-type layer 64 is divided into two regions 64a and 64b (corresponding to the n-type layers 3 and 5 in FIG. 1A, respectively). In this manner, an end of the gate electrode 21a which will be formed later and an end of the n-type layer 64a are aligned with each other, and the other end of the gate electrode 21a and an end of the n-type layer 64b are aligned with each other.

As is shown in FIGS. 9(4)A and 9(4)B, the gate electrode 21a of the detection section 20 is formed, and then the source region 22 of the P-MOS transistor is formed by $p^+$ ion implantation using the gate electrode 21a and the resist pattern 8 as masks.

As is shown in FIG. 9(5)B, the resist pattern 8 is removed and a resist pattern 70 is formed so as to cover the source region 22. As is shown in FIGS. 9(5)A and 9(5)B, the $n^+$-type layer 4 of the reset drain section 40 is formed by ion implantation using the gate electrodes 11a, 21a, 31a, 51 and 52 and the resist pattern 70 as masks.

In this manner, the charge detection device 80 in which an end of the gate electrode 21a and an end of the n-type layer 3 are aligned with each other is produced. By providing such a charge detection device 80 on the same substrate as a charge transfer device, a charge transfer and detection device is produced.

The charge transfer device is formed under the conditions fulfilling Equations (5) and (11). The concentration of the detection section 20 is enhanced on the side of the surface thereof as follows based on Equation (5):

$$\left.\begin{array}{l} \text{concentration of the p-well I} \\ N_{P1} = 5 \times 10^{15} \text{cm}^3 \\ \text{depth of the junction of the p-well I} \\ x_{P1} = 1.8\ \mu\text{m} \\ \text{concentration of the p-well II} \\ N_{P2} = 3 \cdot 10^{16} \text{cm}^3 \\ \text{depth of the junction of the p-well II} \\ x_{P2} = 0.3\ \mu\text{m} \end{array}\right\} \quad (14)$$

Figure 10:
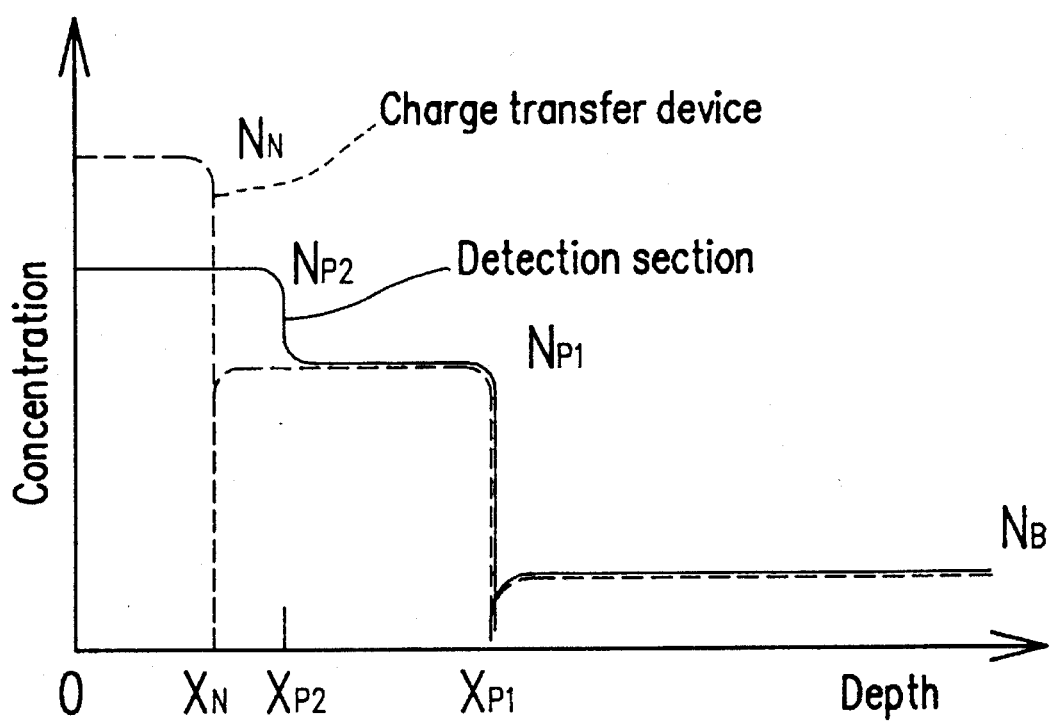
FIG. 10 is a diagram illustrating the concentration of each of the layers in the charge detection device produced by the production method shown in FIGS. 9(1)A through 9(5)A and 9(1)B through 9(5)B.

This state is shown in FIG. 10. Where the substrate voltage $V_B$=10 V, and the gate voltage $V_G$=20 V, when $q_{sig}$=0, $$\left.\begin{array}{l} \phi_S = 14.21\ \text{V} \\ V_S = 3.98\ \text{V} \\ d_1 = 1.54\ \mu\text{m} \\ d_2 = 6.72\ \mu\text{m} \end{array}\right\} \quad (15)$$

When $q_{sig}$=$10^{12}$el/cm$^2$, $$\left.\begin{array}{l} \phi_S = 10.50\ \text{V} \\ V_S = 0.90\ \text{V} \\ d_1 = 1.49\ \mu\text{m} \\ d_2 = 8.12\ \mu\text{m} \end{array}\right\} \quad (16)$$

Accordingly, based on Equation (4), when $q_{sig}$=0, G=0.81, and when $q_{sig}$=$10^{12}$el/cm$^2$, G=0.84. Thus, there is no practical problem in the linearity.

Where the area $S_G$ of the gate of the detection section 20 is $S_G$=10 $\mu$m$^2$, $$\Delta V_s/N_{sig}=31\ \text{to}\ 32\ \mu\text{V/el} \quad (17)$$

This figure is almost the same as the figure obtained under the conditions expressed by Equation (5).

The conditions for obtaining the characteristics illustrated in FIG. 10 can easily be achieved by the method described above with reference to FIGS. 9(1)A through 9(5)A and 9(1)B through 9(5)B.

Figure 11A:
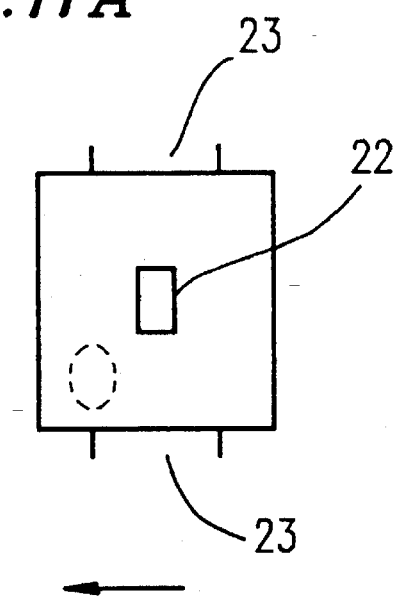
FIG. 11A is a partial top view of the charge detection device shown in FIG. 1A illustrating a positional relationship between a source region and a drain region of a P-MOS transistor.
Figure 11B:
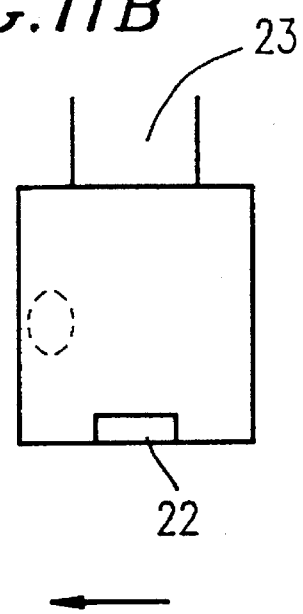
FIG. 11B is a partial top view illustrating a relationship between the source region and the drain region of a P-MOS transistor which is usable for the charge detection device shown in FIG. 1A.

FIG. 11A shows planar relationship between the source region 22 and the drain region 23. The present invention is not limited to such positional relationship. For example, the source region 22 may be closer to one of the two drain regions 23 instead of being located at the middle of the two drain regions 23. Alternatively, as is shown in FIG. 11B, one drain region 23 may be provided with being isolated from the source region 22. In these cases, the drain region 23 and the source region 22 can be designed in an arbitrary positional relationship.

As long as the area of the p-well 2 neutralized as shown in FIGS. 4A through 4C is not substantially located at a position where the detection is performed, such a neutralized area does not have substantial effect on the detection. Accordingly, the relationship among the gate voltage $V_G$, the p-well voltage $V_{PW}$ (=0 V) and the substrate voltage $V_B$ can be reduced in strictness to the extent that the neutralized area is located as indicated by dashed lines in FIGS. 11A and 11B.

When the p-well voltage $V_{PW}$ is fixed to 0 V, a depletion area of the p-well 2 is expanded from the surface thereof in accordance with the increase in the gate voltage $V_G$, and an another depletion area is expanded from the side of the n-type substrate 1 in accordance with the increase in the substrate voltage $V_B$. According to the present invention, the state in which the two depletion areas are connected to each other (hereinafter, referred to as the punch-through state) is used. As the quantity of the signal charge is increased, the depletion area on the side of the surface is decreased. The gate voltage $V_G$ and the substrate voltage $V_B$ are determined so that the punch-through state is realized when the signal charge is accumulated to the maximum possible level on a practical basis. Since the gate voltage $V_G$ and the substrate voltage $V_B$ are related to each other, there are various ways for setting these voltages.

Figure 12A:
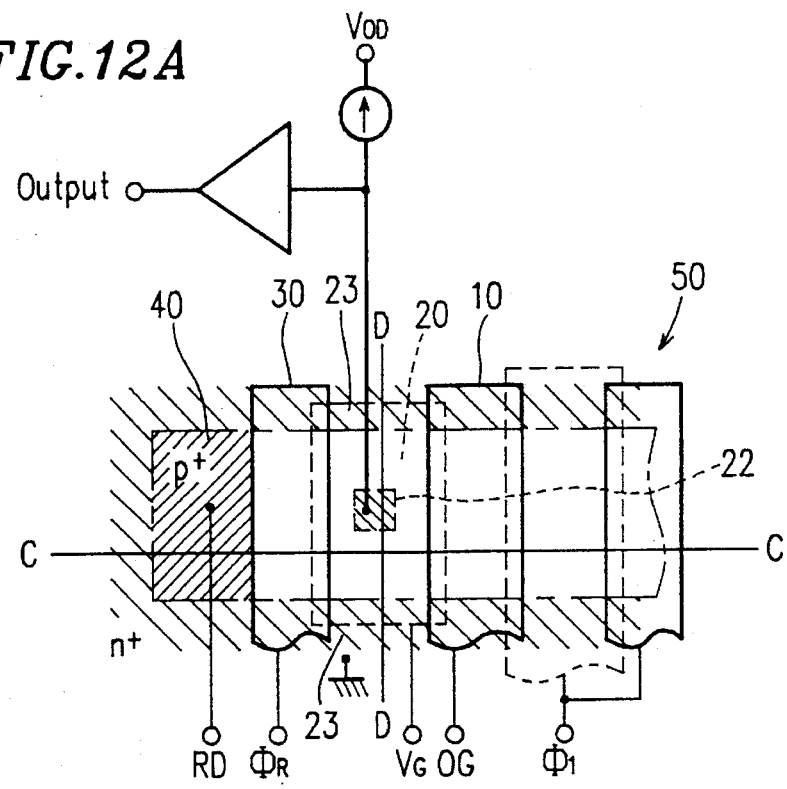
FIG. 12A is a schematic top view of a charge detection device in another example according to the present invention.
Figure 12B:
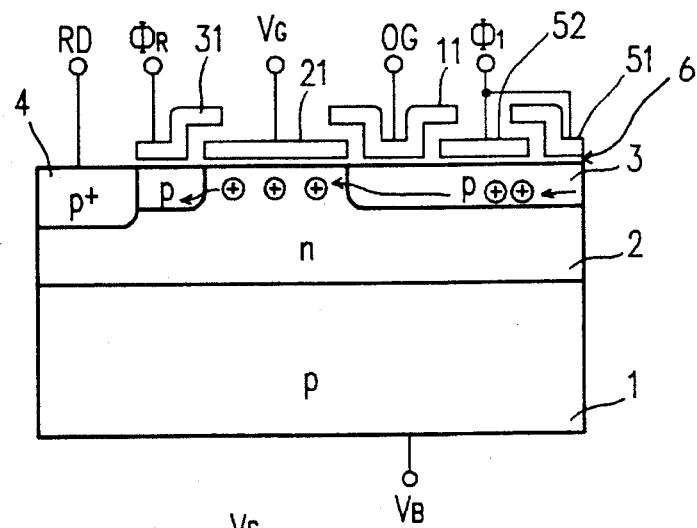
FIG. 12B is a cross sectional view of the charge detection device shown in FIG. 12A taken along line C—C in FIG. 12A.
Figure 12C:
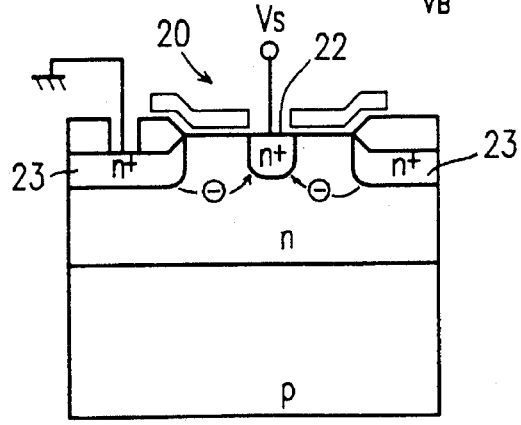
FIG. 12C is a cross sectional view of the charge detection device shown in FIG. 12A taken along line D—D in FIG. 12A.
Figure 13A:
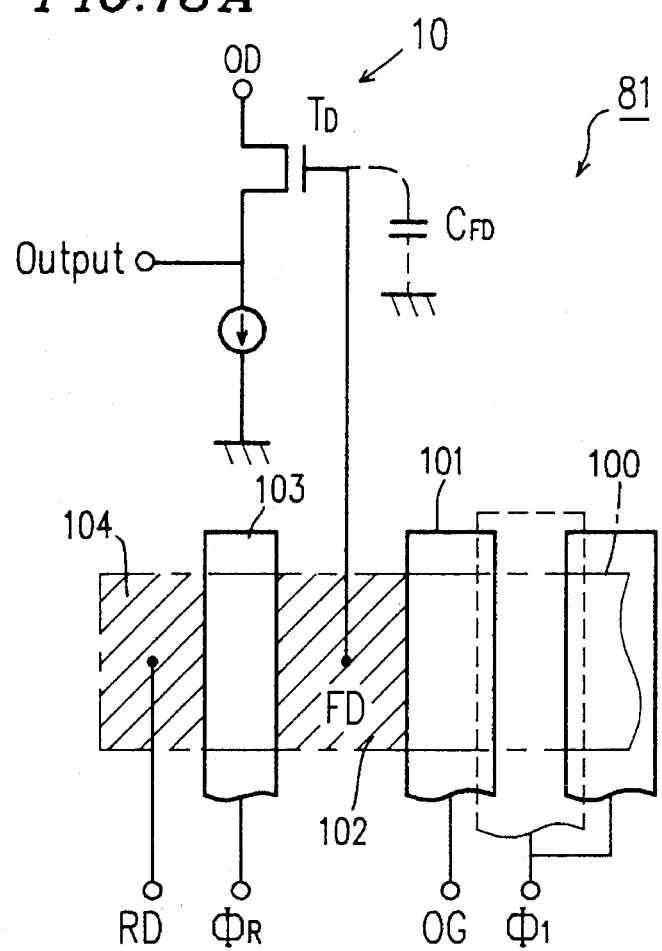
FIG. 13A is a schematic top view of a conventional charge detection device of the FDA type.
Figure 13B:
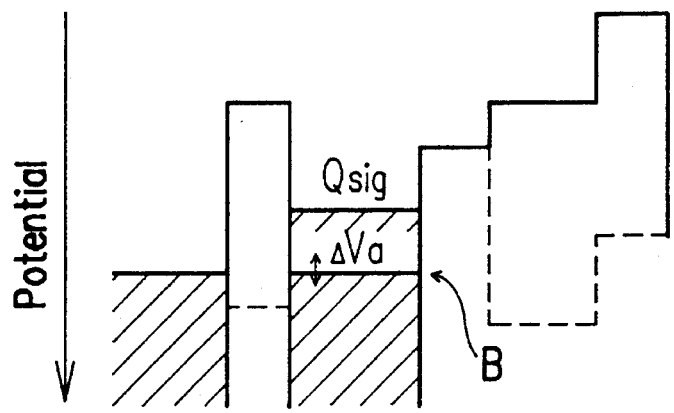
FIG. 13B is a diagram illustrating the potential distribution of the charge detection device shown in FIG. 13A in the signal charge transfer direction.
Figure 14A:
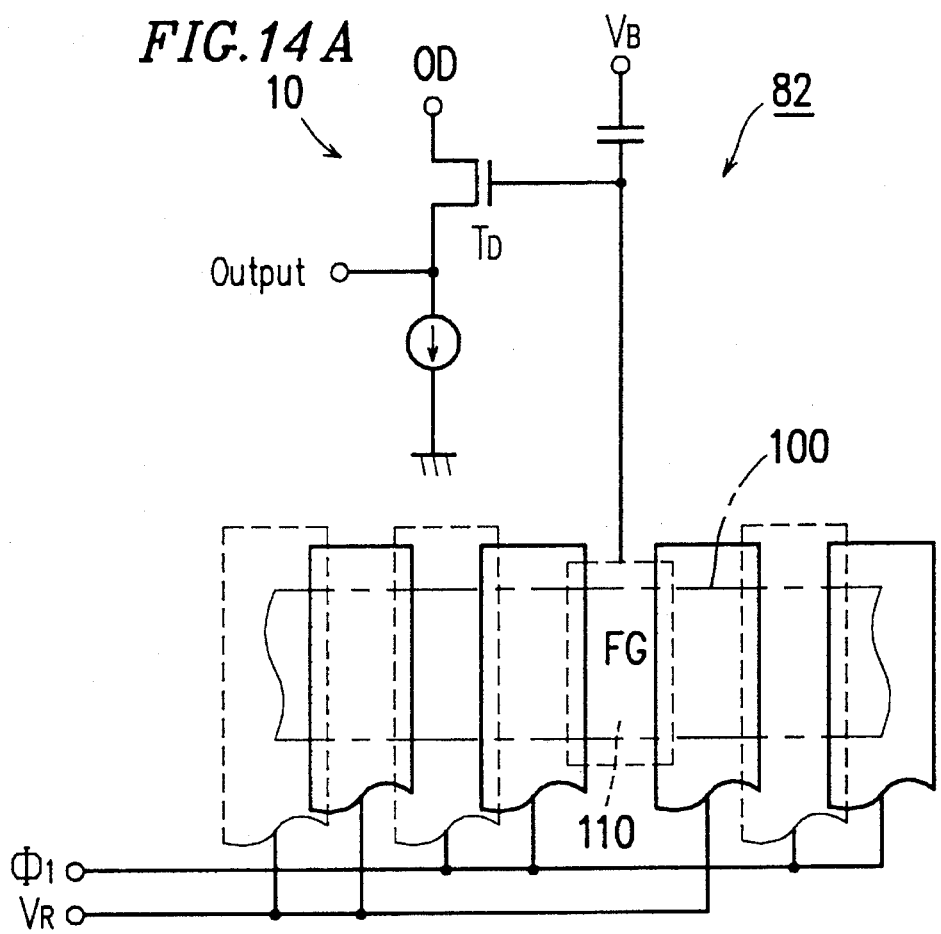
FIG. 14A is a schematic top view of a conventional charge detection device of the FGA type.
Figure 14B:
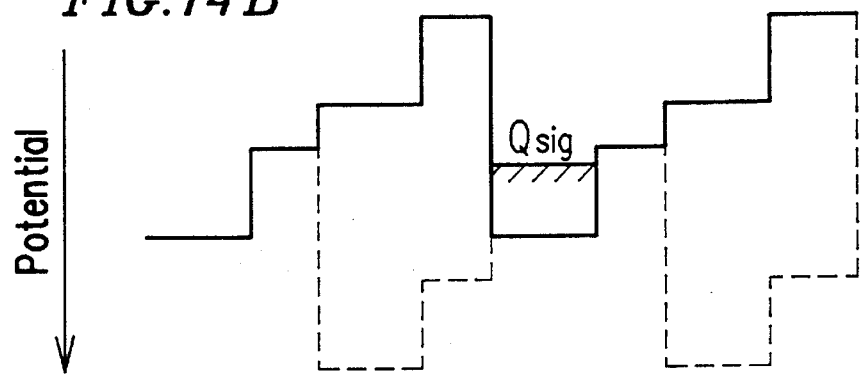
FIG. 14B is a diagram illustrating the potential distribution of the charge detection device shown in FIG. 14A in the signal charge transfer direction.
Figure 15A:
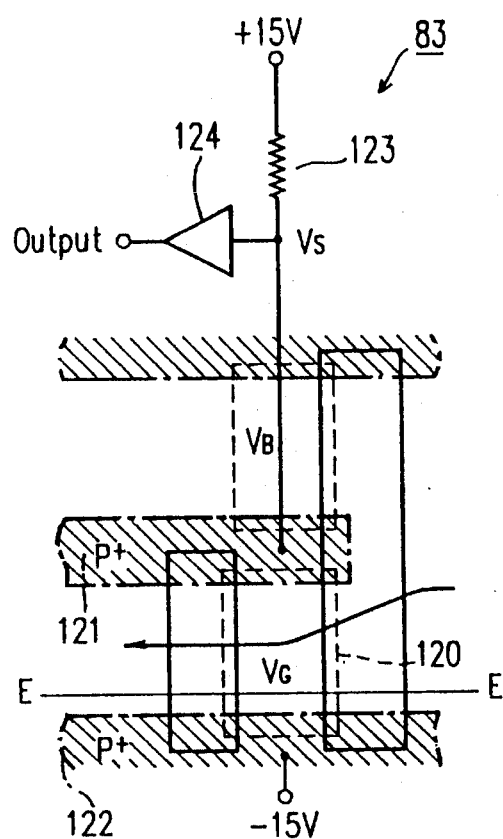
FIG. 15A is a schematic top view of a conventional charge detection device of the FSD type.
Figure 15C:
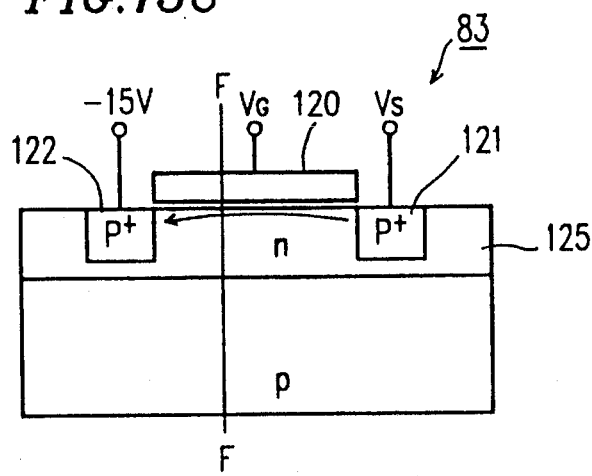
FIG. 15C is a cross sectional view of the charge detection device shown in FIG. 15A taken along line E—E in FIG. 15A.
Figure 15B:
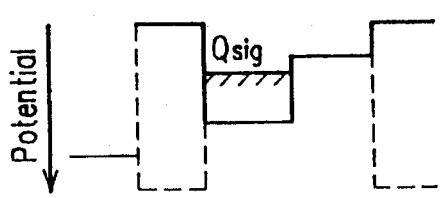
FIG. 15B is a diagram illustrating the potential distribution of the charge detection device shown in FIG. 15A in the signal charge transfer direction.
Figure 15D:
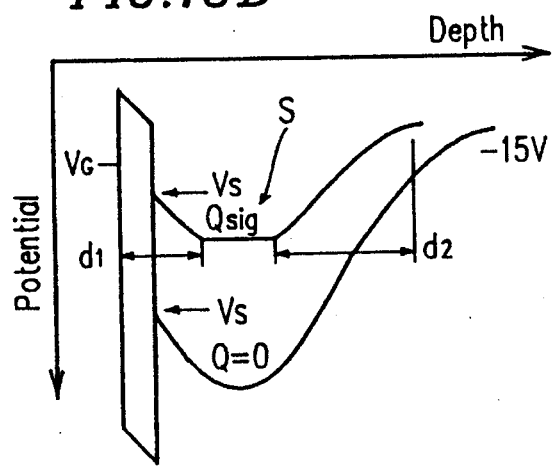
FIG. 15D is a diagram illustrating the potential distribution of the charge detection device shown in FIG. 15A in the depth direction along line F—F in FIG. 15C.
Figure 16A:
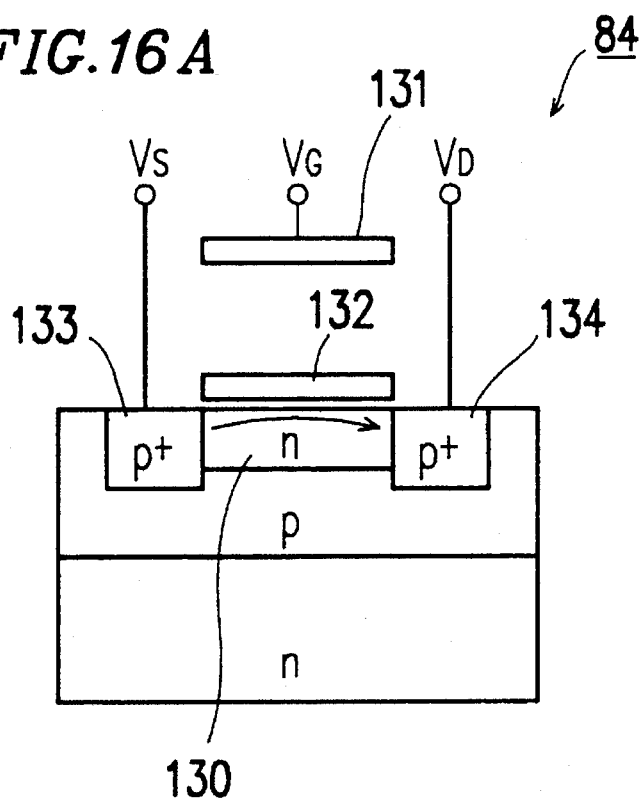
FIG. 16A is a schematic top view of a conventional charge detection device of the FSA type.
Figure 16B:
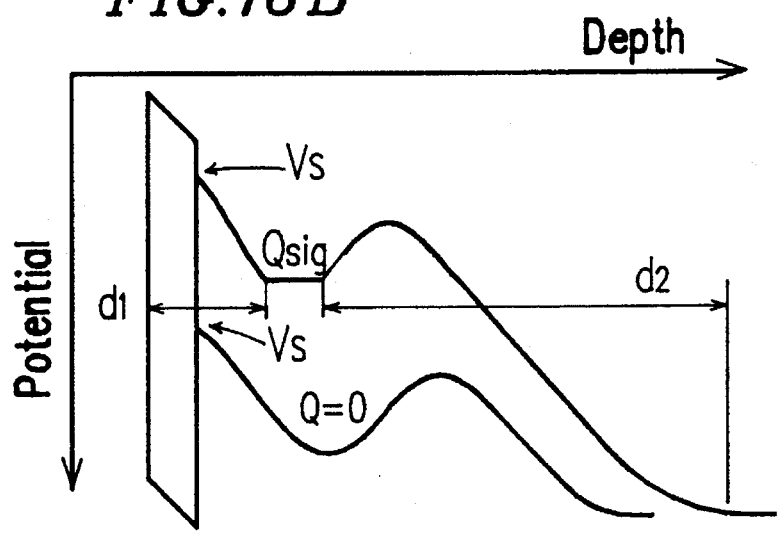
FIG. 16B is a diagram illustrating the potential distribution of the charge detection device shown in FIG. 16A in the depth direction.
Figure 17A:
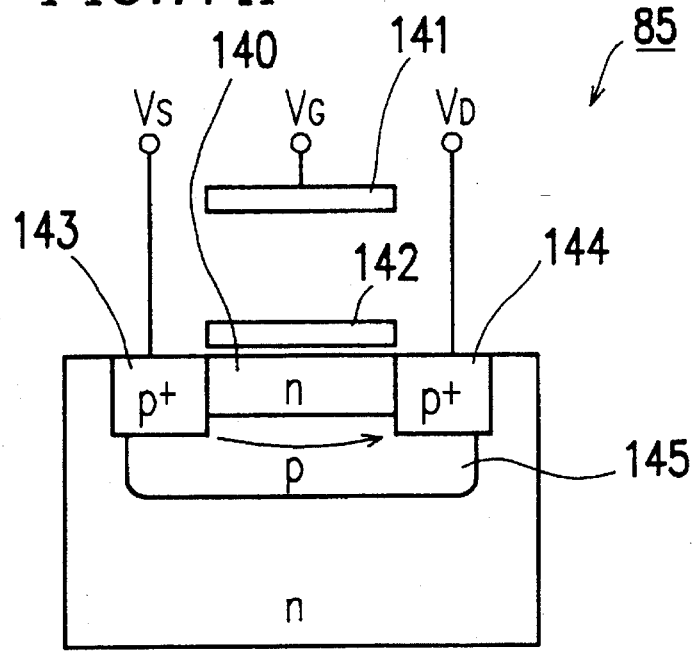
FIG. 17A is a schematic top view of a conventional charge detection device of the FWA type.
Figure 17B:
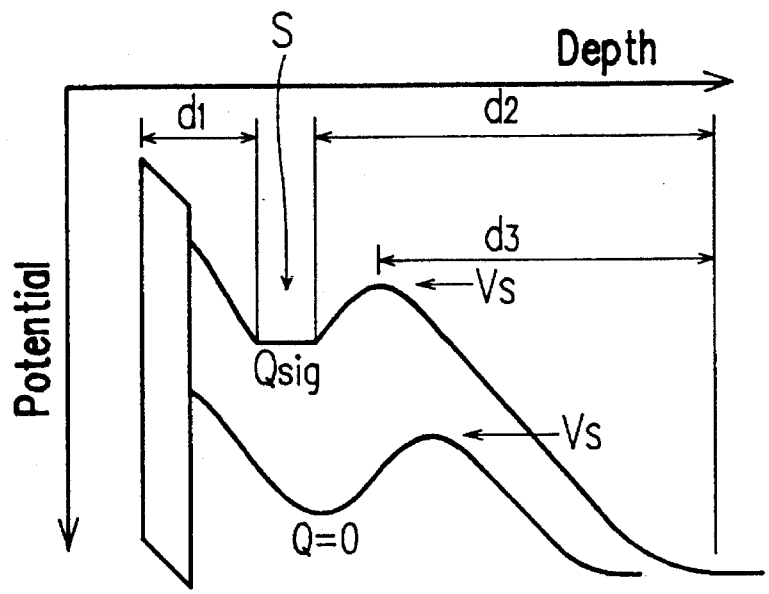
FIG. 17B is a diagram illustrating the potential distribution of the charge detection device shown in FIG. 17A in the depth direction.
Figure 18:
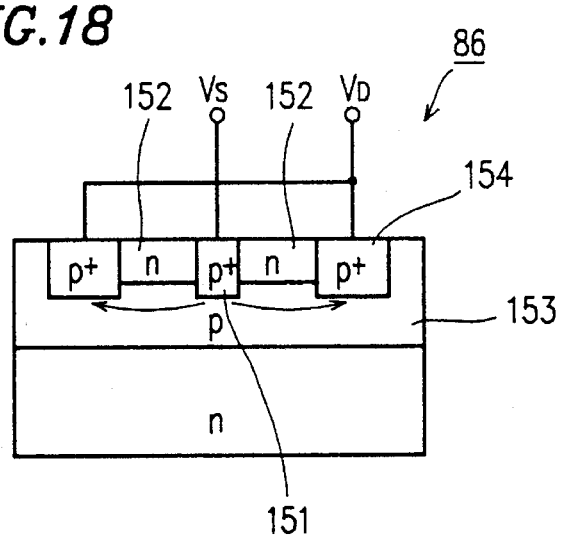
FIG. 18 is a cross sectional view of a conventional charge detection device of the RJG type.
Figure 19A:
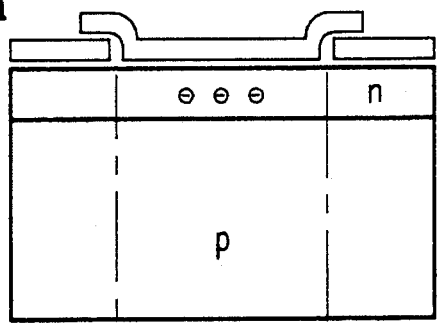
FIGS. 19A and 19B are views showing the two-dimensional effect in a conventional charge detection device.
Figure 19B:
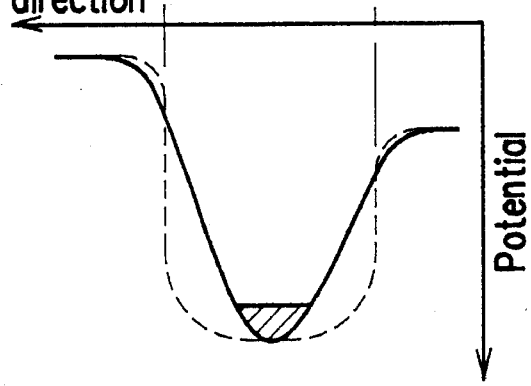

In the above example, a CCD having an n-type buried channel for the signal charge consisting of electrons is used as the charge transfer device. A CCD having a p-type buried channel for a signal charge consisting of holes can also be used as the charge transfer device. In such a case, the polarities of conductivity of the semiconductor layers are inverted. FIG. 12A is a schematic top view of a charge detection device used in combination with a CCD having a p-type buried channel, FIG. 12B is a cross sectional view of the charge detection device in FIG. 12A taken long line C—C in FIG. 12A, and FIG. 12C is a cross sectional view of the charge detection device in FIG. 12A taken long line D—D in FIG. 12A. As shown in FIGS. 12B and 12C, the signal charge consisting of holes is accumulated in the surface region of an n-well 2 and a transistor current consisting of electrons are flows in the n-well 2. In the charge detection device illustrated in FIGS. 12A through 12C have the same effects as the charge detection device 80.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A charge detection device for converting a signal charge, consisting of carriers of a first polarity, externally provided, into a voltage signal, the charge detection device comprising a MOS transistor, the MOS transistor including:

a semiconductor substrate of a first conductivity type;

a first semiconductor layer having a transistor channel for carriers of a second polarity, the first semiconductor layer being formed in the semiconductor substrate and having a second conductivity type, the carriers of the second polarity being majority carriers of the first semiconductor layer;

an insulating layer provided on the first semiconductor layer; and a gate electrode provided on the insulating layer, wherein transistor characteristics of the MOS transistor are changed by the signal charge accumulated in a surface region of the first semiconductor layer immediately below an interface between the first semiconductor layer and the insulating layer, said charge detection device thereby detecting a quantity of the signal charge.

2. A charge detection device according to claim 1, wherein the MOS transistor further includes a source region, a drain region, and a channel region, the source region and the drain region are formed in surface regions on the first semiconductor layer and have the second conductivity type, and the channel region is provided between the source region and the drain region.

3. A charge detection device according to claim 2, wherein:

a reverse bias voltage is applied across the semiconductor substrate and the drain region, the gate electrode is applied with a prescribed voltage to form a channel potential which accumulates the signal charge at the surface of the channel region and provides a transistor channel below the surface of the channel region, and the source region is connected to a power source via a load, thereby detecting the quantity of the signal charge.

4. A charge detection device according to claim 2, wherein a path in which the signal charge is transferred and the transistor channel of the MOS transistor run in directions crossing each other, in the state of being isolated from each other in the depth direction.

5. A charge detection device according to claim 2, further comprising a charge input section, the charge input section including:

a second semiconductor layer provided in a surface region of the first semiconductor layer in contact with the channel region and having the first conductivity; and an input gate electrode, provided above the second semiconductor layer, with another insulating layer sandwiched therebetween, for controlling an input of the signal charge to the channel region.

6. A charge detection device according to claim 5, wherein the drain region includes a first sub-region and a second sub-region opposed to each other, the first and second sub-regions interpose a portion of the surface region of the first semiconductor layer and the source region is provided between the first and the second sub-regions in a state of isolation from the charge input section.

7. A charge detection device according to claim 5, wherein, the drain region includes a first sub-region and a second sub-region opposed to each other, the first and said sub-regions interpose a portion of the surface region of the first semiconductor layer, and the source region is provided at a center of the portion of the surface region.

8. A charge detection device according to claim 7, wherein the gate electrode has a shape surrounding the source region.

9. A charge detection device according to claim 5, wherein:

a reverse bias voltage is applied across the semiconductor substrate and the drain region, the gate electrode is applied with a prescribed voltage to form a channel potential which accumulates the signal charge at the surface of the channel region and provides a transistor channel below the surface of the channel region, and the source region is connected to a power source via a load, thereby detecting the quantity of the signal charge in accordance with a timing of applying a voltage with the input gate electrode.

10. A charge detection device according to claim 5, further comprising a reset section, the reset section including:

a third semiconductor layer having the first conductivity type and provided in a surface region of the first semiconductor layer in contact with the channel region and isolated from the second semiconductor layer; and a reset gate electrode, provided above the third semiconductor, with still another insulating layer sandwiched therebetween.

11. A charge detection device according to claim 10, wherein:

a reverse bias voltage is applied across the semiconductor substrate and the drain region, the gate electrode is applied with a prescribed voltage to form a channel potential which accumulates the signal charge at the surface of the channel region and provides a transistor channel below the surface of the channel region, and the source region is connected to a power source via a load, thereby detecting the quantity of the signal charge in accordance with a timing of applying a voltage with the reset Gate electrode.

12. A charge transfer and detection apparatus, comprising:

a charge transfer device for transferring a signal charge, consisting of carriers of a first polarity; and a charge detection device for converting the signal charge provided by the charge transfer device into a voltage signal, wherein the charge detection device includes a MOS transistor having:

a semiconductor substrate of a first conductivity type;

a first semiconductor layer having a transistor channel for carriers of a second polarity, the first semiconductor layer being formed in the semiconductor substrate and having a second conductivity type, the carriers of the second polarity being majority carriers of the first semiconductor layer;

a insulating layer provided on the first semiconductor layer; and a gate electrode provided on the insulating layer; and wherein transistor characteristics of the MOS transistor are changed by the signal charge accumulated in a surface region, of the first semiconductor layer, immediately below an interface between the first semiconductor layer and the insulating layer, said apparatus thereby detecting a quantity of the signal charge.

13. A charge transfer and detection apparatus according to claim 12, wherein the charge transfer device and the charge detection device are provided on a single semiconductor substrate.

* * * * *